(12) United States Patent
Nakano

(10) Patent No.: US 11,855,049 B2
(45) Date of Patent: Dec. 26, 2023

(54) SEMICONDUCTOR DEVICE

(71) Applicant: FUJI ELECTRIC CO., LTD., Kawasaki (JP)

(72) Inventor: Hayato Nakano, Kofu (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 211 days.

(21) Appl. No.: 17/214,075

(22) Filed: Mar. 26, 2021

(65) Prior Publication Data
US 2021/0375832 A1 Dec. 2, 2021

(30) Foreign Application Priority Data

May 28, 2020 (JP) ................................. 2020-093371
Dec. 3, 2020 (JP) ................................. 2020-201319

(51) Int. Cl.
| | |
|---|---|
| *H01L 23/18* | (2006.01) |
| *H01L 23/52* | (2006.01) |
| *H01L 25/07* | (2006.01) |
| *H01L 23/31* | (2006.01) |
| *H01L 23/057* | (2006.01) |
| *H01L 21/56* | (2006.01) |
| *H01L 23/00* | (2006.01) |

(52) U.S. Cl.
CPC ............ *H01L 25/072* (2013.01); *H01L 21/56* (2013.01); *H01L 23/057* (2013.01); *H01L 23/3107* (2013.01); *H01L 24/73* (2013.01); *H01L 2224/73221* (2013.01); *H01L 2924/13055* (2013.01)

(58) Field of Classification Search
CPC ..... H01L 25/072; H01L 21/56; H01L 23/057; H01L 23/3107
USPC ........................................................ 257/773
See application file for complete search history.

(56) References Cited

U.S. PATENT DOCUMENTS

| | | | |
|---|---|---|---|
| 6,396,159 B1 | 5/2002 | Shoji | |
| 8,183,094 B2 * | 5/2012 | Shikano | .................. H01L 24/49 |
| | | | 257/E21.502 |

(Continued)

FOREIGN PATENT DOCUMENTS

| | | |
|---|---|---|
| JP | H11-026652 A | 1/1999 |
| JP | 2000-174170 A | 6/2000 |

(Continued)

*Primary Examiner* — Caleb E Henry
*Assistant Examiner* — Dilinh P Nguyen
(74) *Attorney, Agent, or Firm* — Rabin & Berdo, P.C.

(57) ABSTRACT

A semiconductor device including a semiconductor chip, an insulating circuit board having a circuit pattern formed on an insulating plate, a case including a frame part having an opening that is substantially rectangular in a plan view of the semiconductor device, inner wall surfaces of the frame part at the opening forming a storage part to store the insulating circuit board, and a printed circuit board which has a flat plate shape and which protrudes from one of the inner wall surfaces of the frame part toward the storage part. The semiconductor device further includes a sealing material filled in the storage part, to thereby seal the semiconductor chip and the printed circuit board. A front surface of the sealing material forms a sealing surface, and in a thickness direction of the semiconductor chip, the sealing surface is higher around the printed circuit board than around the semiconductor chip.

24 Claims, 15 Drawing Sheets

(56) References Cited

U.S. PATENT DOCUMENTS

| | | | | |
|---|---|---|---|---|
| 9,520,345 | B2* | 12/2016 | Ishino | H01L 23/49537 |
| 10,959,333 | B2* | 3/2021 | Inoue | H01L 24/45 |
| 2018/0182694 | A1 | 6/2018 | Soyano | |

FOREIGN PATENT DOCUMENTS

| | | |
|---|---|---|
| JP | 2013-020997 A | 1/2013 |
| WO | 2017/163583 A1 | 9/2017 |

* cited by examiner

US 11,855,049 B2

SEMICONDUCTOR DEVICE

CROSS-REFERENCE TO RELATED APPLICATIONS

This application is based upon and claims the benefits of priority of the prior Japanese Patent Application No. 2020-093371, filed on May 28, 2020, and the Japanese Patent Application No. 2020-201319, filed on Dec. 3, 2020, the entire contents of which are incorporated herein by reference.

BACKGROUND OF THE INVENTION

1. Field of the Invention

The embodiments discussed herein relate to a semiconductor device and a manufacturing method thereof.

2. Background of the Related Art

Semiconductor devices include power devices and are used as power conversion devices. These power devices include semiconductor chips, which are IGBTs (insulated gate bipolar transistors) or power MOSFETs (metal-oxide-semiconductor field-effect transistors), for example. Such a semiconductor device includes at least a semiconductor chip, a ceramic circuit board on which the semiconductor chip is disposed, and a printed circuit board. The printed circuit board supplies a gate voltage to a gate of the semiconductor chip at predetermined timing. In addition, the semiconductor device includes a ceramic circuit board on which the semiconductor chip is disposed, a case in which the printed circuit board is stored, and sealing material that seals the case. The case includes an external connection terminal having, at an end thereof, a connection part electrically connected to the ceramic circuit board in the case. The connection part of the external connection terminal is also sealed with the sealing material in the case.
International Publication Pamphlet No. 2017/163583

In the case of this semiconductor device, the ceramic circuit board on which the semiconductor chip is disposed, the printed circuit board, the connection part of the external connection terminal, etc. in the case are sealed with the sealing material. This sealing is performed by filling the case with melted sealing material. However, depending on the arrangement, shapes, etc. of the ceramic circuit board, the printed circuit board, the connection part of the external connection terminal, etc. in the case, some of the parts could not be sufficiently sealed with the sealing material. As a result, voids could occur around these parts, and the reliability of the semiconductor device is deteriorated.

SUMMARY OF THE INVENTION

According to one aspect of the embodiments, there is provided a semiconductor device including a semiconductor chip having a front surface and a rear surface, the semiconductor chip including a main electrode on the front surface thereof; an insulating circuit board, including an insulating plate, and a circuit pattern formed on a front surface of the insulating plate, the rear surface of the semiconductor chip being disposed on the circuit pattern; a case including a frame part having an opening that is substantially rectangular in a plan view of the semiconductor device, inner wall surfaces of the frame part at the opening forming a storage part to store the insulating circuit board, and a printed circuit board which has a flat plate shape and which is formed to protrude from one of the inner wall surfaces of the frame part toward the storage part; and a sealing material filled in the storage part, to thereby seal the semiconductor chip and the printed circuit board, wherein a front surface of the sealing material forms a sealing surface, and in a thickness direction of the semiconductor chip, the sealing surface is higher around the printed circuit board than around the semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
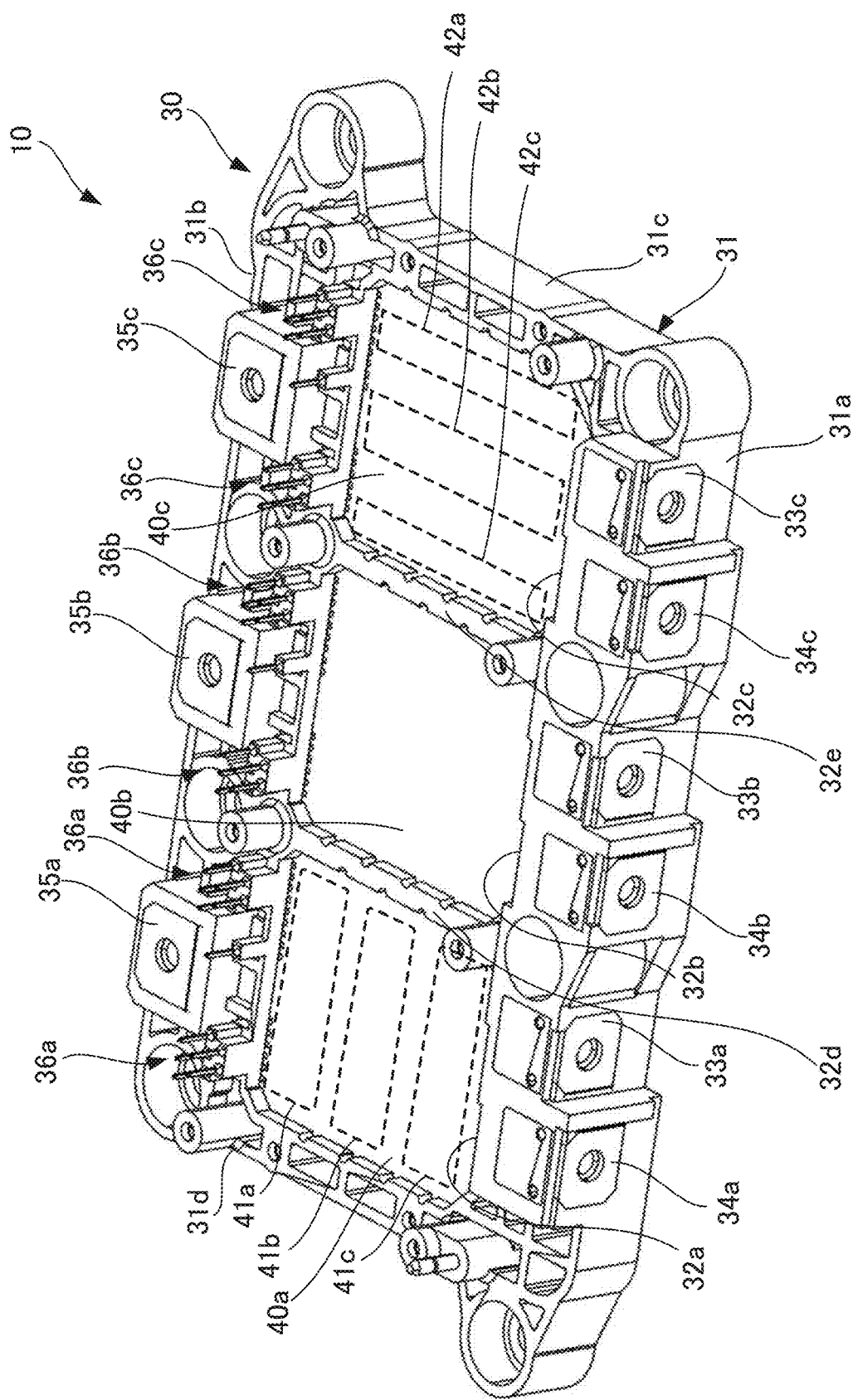
FIG. 1 is a perspective view of a semiconductor device according to a first embodiment.

Hereinafter, embodiments will be described with reference to drawings. In the following embodiments, a front surface (an upward direction) represents an upper surface (direction) of a semiconductor device 10 in FIG. 1. The perspective view in FIG. 1 represents the front surface and side surfaces of the semiconductor device 10. For example, the sealing surfaces of sealing material 40a, 40b, and 40c, which seal storage parts 32a, 32b, and 32c of a case 30, respectively, represent front surfaces (upward directions). A rear surface (a downward direction) represents a lower surface (direction) of the semiconductor device 10 in FIG. 1. For example, a surface of the case 30 on which a heat radiation plate 28 is disposed represents a rear surface (a downward direction). In the drawings other than FIG. 1, the terms "front surface" (upper direction) and "rear surface" (downward direction) also represent their respective directions described above.

First Embodiment

Figure 2:
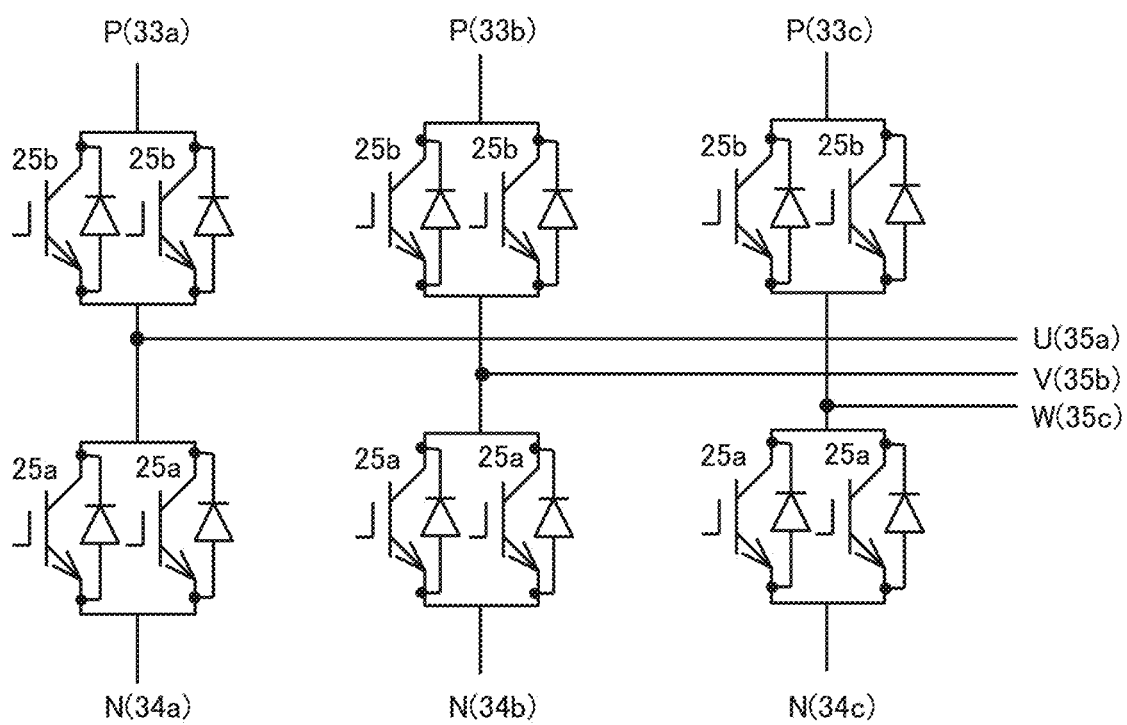
FIG. 2 is a circuit diagram illustrating an equivalent circuit of the semiconductor device according to the first embodiment.

A semiconductor device according to a first embodiment will be described with reference to FIGS. 1 and 2. FIG. 1 is a perspective view of a semiconductor device according to a first embodiment, and FIG. 2 is a circuit diagram illustrating an equivalent circuit of the semiconductor device according to the first embodiment. In FIG. 1, only main components are denoted by reference characters.

Figure 11:
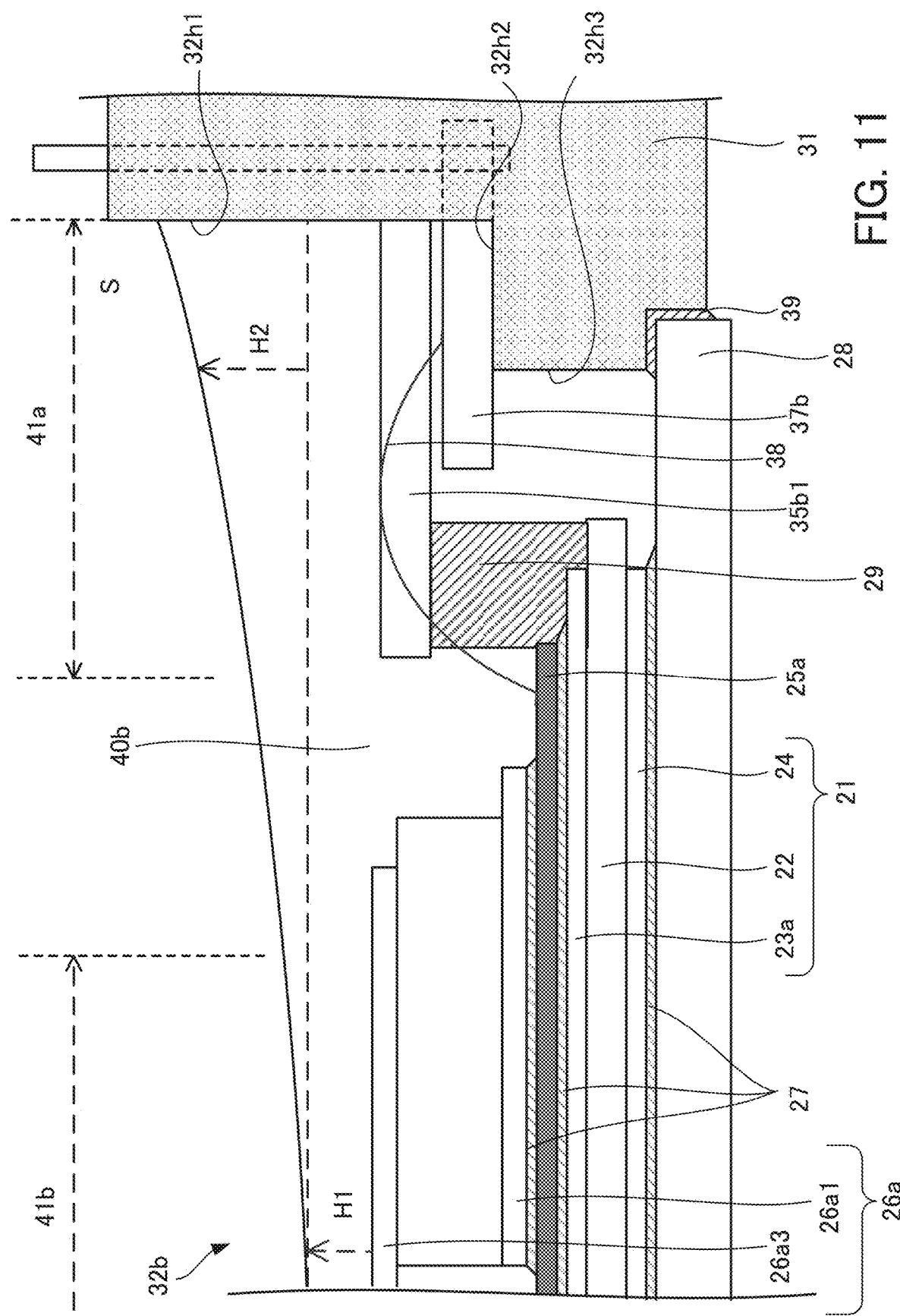
FIG. 11 illustrates the sealing material included in the semiconductor device according to the first embodiment (part 2)

As illustrated in FIG. 1, this semiconductor device 10 includes semiconductor units (not illustrated), the case 30 in which the semiconductor units are stored, and the sealing material 40a, 40b, and 40c with which the semiconductor units are sealed. In addition, the semiconductor device 10 may include the heat radiation plate 28 (not illustrated in FIG. 1) as illustrated in FIG. 11, on which the semiconductor units are disposed and which is formed on the rear surface of the case 30. The semiconductor units will be described in detail below.

The case 30 is approximately rectangular in a plan view and has a frame part 31 having a pair of frame-part long sides 31a and 31b and a pair of frame-part short sides 31c and 31d. The case 30 includes the storage parts 32a, 32b, and 32c along the pair of frame-part long sides 31a and 31b. The storage parts 32a, 32b, and 32c are partitioned by partition parts 32d and 32e. These partition parts 32d and 32e are formed to be parallel to the pair of frame-part short sides 31c and 31d and perpendicular to the pair of frame-part long sides 31a and 31b. Thus, each of the storage parts 32a, 32b, and 32c is approximately rectangular in a plan view. A semiconductor unit is stored in each of the storage parts 32a, 32b, and 32c and is sealed with the corresponding one of the sealing material 40a, 40b, and 40c. In addition, as illustrated by dashed lines in the storage part 32a, an output-side area 41a, an intermediate area 41b, and an input-side area 41c are set in this order in the storage part 32a from the frame-part long side 31b (one short side of the storage part 32a) to the frame-part long side 31a (the other short side of the storage part 32a). While not illustrated, an output-side area 41a, an intermediate area 41b, and an input-side area 41c are also set in this order in each of the storage parts 32b and 32c. In addition, as illustrated by dashed lines in the storage part 32c, a long-side area 42a, an intermediate area 42b, and a long-side area 42c are set in this order in the storage part 32c from the frame-part short side 31c (one long side of the storage part 32c) to the frame-part short side 31d (the other short side of the storage part 32c). While not illustrated, long-side areas 42a and 42c and an intermediate area 42b are also set in this order in each of the storage parts 32a and 32b.

The sealing material 40a, 40b, and 40c seal the semiconductor units disposed in the storage parts 32a, 32b, and 32c. The sealing material 40a, 40b, and 40c may be thermosetting resin. For example, the thermosetting resin is epoxy resin, phenol resin, maleimide resin, or polyester resin. Preferably, the thermosetting resin is epoxy resin. In addition, the sealing material 40a, 40b, and 40c may contain filler. The filler is ceramic material having insulation properties and high thermal conductivity. The filler is, for example, silicon oxide, aluminum oxide, boron nitride, or aluminum nitride. The content of the filler of the sealing material 40a, 40b, or 40c is between 10 vol % and 70 vol %, inclusive, of this sealing material 40a, 40b, or 40c.

The sealing surfaces of the sealing material 40a, 40b, and 40c are not parallel to the rear surfaces of the sealing material 40a, 40b, and 40c. That is, the heights of the sealing surfaces of the sealing material 40a, 40b, and 40c from the rear surfaces are different from each other, depending on the areas in the storage parts 32a, 32b, and 32c. Specifically, when seen from a long side of one of the storage parts 32a, 32b, and 32c, the height in the output-side area 41a is higher than the height in the intermediate area 41b in the thickness direction of a semiconductor chip 25a, 25b from the rear surface toward the front surface thereof. The heights of the sealing surfaces of the sealing material 40a, 40b, and 40c in the output-side area 41a, the intermediate area 41b, and the input-side area 41c will be described below in detail with reference to FIGS. 10A and 10B. In addition, when seen from a short side of one of the storage parts 32a, 32b, and 32c, the height in the intermediate area 42b is higher than the height in the long-side areas 42a and 42c in the thickness direction of the semiconductor chip 25a, 25b from the rear surface toward the front surface thereof. The heights of the sealing surfaces of the sealing material 40a, 40b, and 40c in the long-side area 42a, the intermediate area 42b, and the long-side area 42c will be described in detail below with reference to FIGS. 10A and 10B.

The case 30 is provided with input terminals on the frame-part long side 31a. Specifically, the input terminals are P terminals 33a, 33b, and 33c and N terminals 34a, 34b, and 34c formed on the frame-part long side 31a. The case 30 is also provided with output terminals on the front surface of the case 30 along the frame-part long side 31b, which is opposite to the frame-part long side 31a on which the input terminals are disposed. Specifically, the output terminals are a U terminal 35a, a V terminal 35b, and a W terminal 35c along the frame-part long side 31b. The P terminal 33a and the N terminal 34a face the U terminal 35a via the storage part 32a. The case 30 is also provided with control terminals 36a beside the U terminal 35a of the storage part 32a. Likewise, the P terminal 33b and the N terminal 34b face the V terminal 35b via the storage part 32b. The case 30 is also provided with control terminals 36b beside the V terminal 35b of the storage part 32b. Likewise, the P terminal 33c and the N terminal 34c face the W terminal 35c via the storage part 32c. The case 30 is also provided with control terminals 36c beside the W terminal 35c of the storage part 32c. The other end of the individual one of the above terminals is electrically connected to a semiconductor chip of a semiconductor unit stored in a corresponding one of the storage parts 32a, 32b, and 32c. For example, the other end of the individual one of the control terminals 36a, 36b, and 36c is electrically connected to a control electrode such as the gate electrode of a semiconductor chip. In addition, the other end of the individual one of the P terminals 33a, 33b, and 33c, the N terminals 34a, 34b, and 34c, and the U, V, W terminals 35a, 35b, and 35c is electrically connected to a main electrode such as the emitter electrode (or the source electrode) or the collector electrode (or the drain electrode) of a semiconductor chip.

The heat radiation plate 28 has a flat plate shape and is rectangular in a plan view. The heat radiation plate 28 may cover the rear surfaces of the storage parts 32a, 32b, and 32c of the case 30 in a plan view (see FIG. 11). The heat radiation plate 28 is made of metal material having excellent thermal conductivity. Examples of the material include aluminum, iron, silver, copper, and an alloy containing at least one kind of these elements. For example, the alloy may be a metal composite of aluminum and silicon carbide (Al—SiC) or a metal composite of magnesium and silicon carbide (Mg—SiC). To improve the corrosion resistance, for example, the surface of the heat radiation plate 28 may be plated with material such as nickel.

A cooling unit (not illustrated) may be attached to the rear surface of the case 30 to which the heat radiation plate 28 has been attached. The cooling unit in this case is made of metal material having excellent thermal conductivity, for example. Examples of the metal material include aluminum, iron, silver, copper, and an alloy containing at least one kind of these elements. For example, the cooling unit is a heatsink or a water cooling jacket having at least one fin. The heat radiation plate 28 may be formed integrally with the cooling unit.

For example, the semiconductor device 10 functions as a three-phase inverter circuit, and an equivalent circuit thereof is illustrated in FIG. 2. FIG. 2 illustrates a case in which reverse conducting (RC)-IGBTs, which are semiconductor chips, are used in an individual semiconductor unit. The reference characters given to the RC-IGBTs in FIG. 2 correspond to semiconductor chips 25a and 25b included in a semiconductor unit 20 illustrated in FIG. 4. Two semiconductor chips 25a are connected in parallel with each other in the lower arm, and two semiconductor chips 25b are connected in parallel with each other in the upper arm. That is, an individual semiconductor unit 20 of a single phase includes two semiconductor chips 25a and two semiconductor chips 25b.

The P terminals 33a, 33b, and 33c are electrically connected to the collector electrodes of the semiconductor chips 25b in the upper arm of the semiconductor units in the storage parts 32a, 32b, and 32c of the semiconductor device 10. The U terminal 35a, the V terminal 35b, and the W terminal 35c are electrically connected to the emitter electrodes of the semiconductor chips 25b in the upper arm and to the collector electrodes of the semiconductor chips 25a in the lower arm of the semiconductor units in the storage parts 32a, 32b, and 32c. The N terminals 34a, 34b, and 34c are electrically connected to the emitter electrodes of the semiconductor chips 25a in the lower arm of the semiconductor units in the storage parts 32a, 32b, and 32c. The semiconductor device 10 consequently functions as an inverter.

Figure 3:
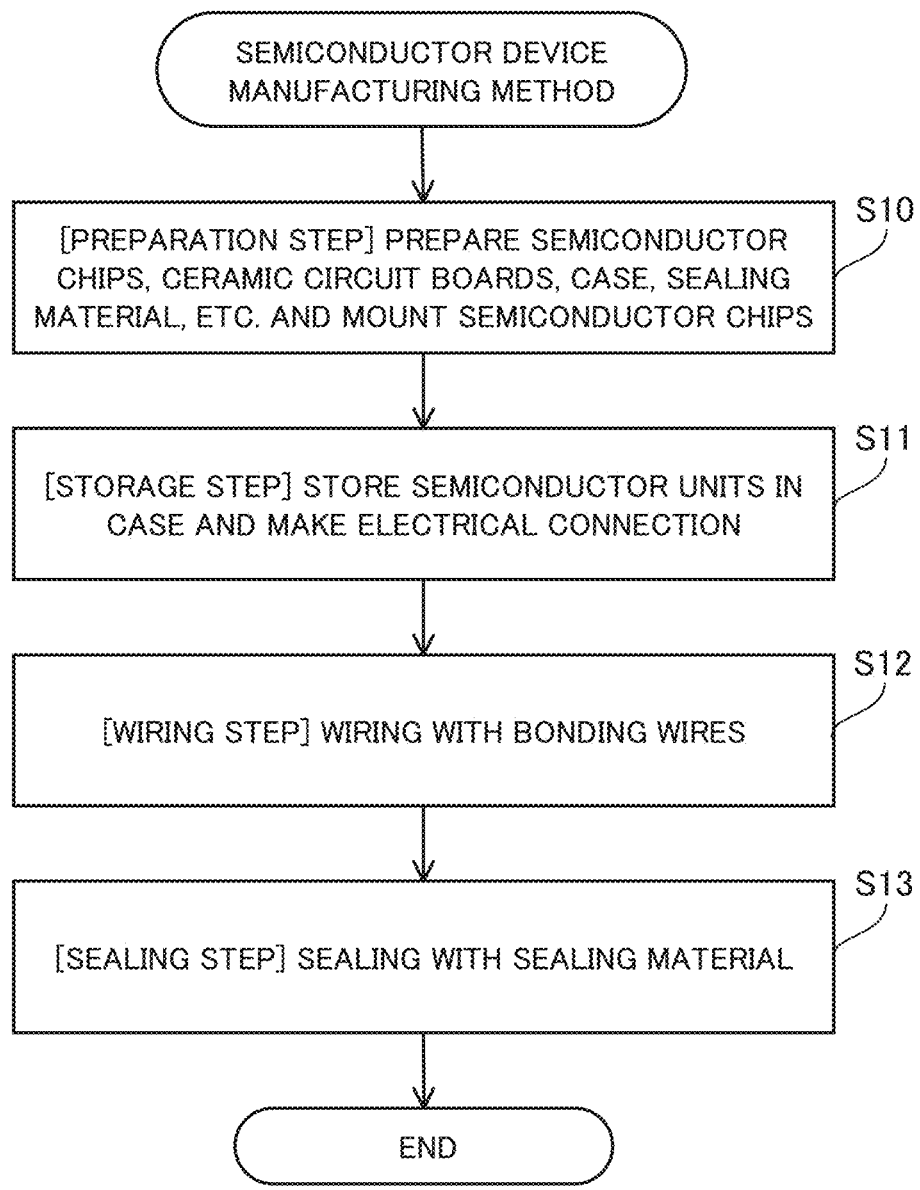
FIG. 3 is a flowchart illustrating a semiconductor device manufacturing method according to the first embodiment.
Figure 4:
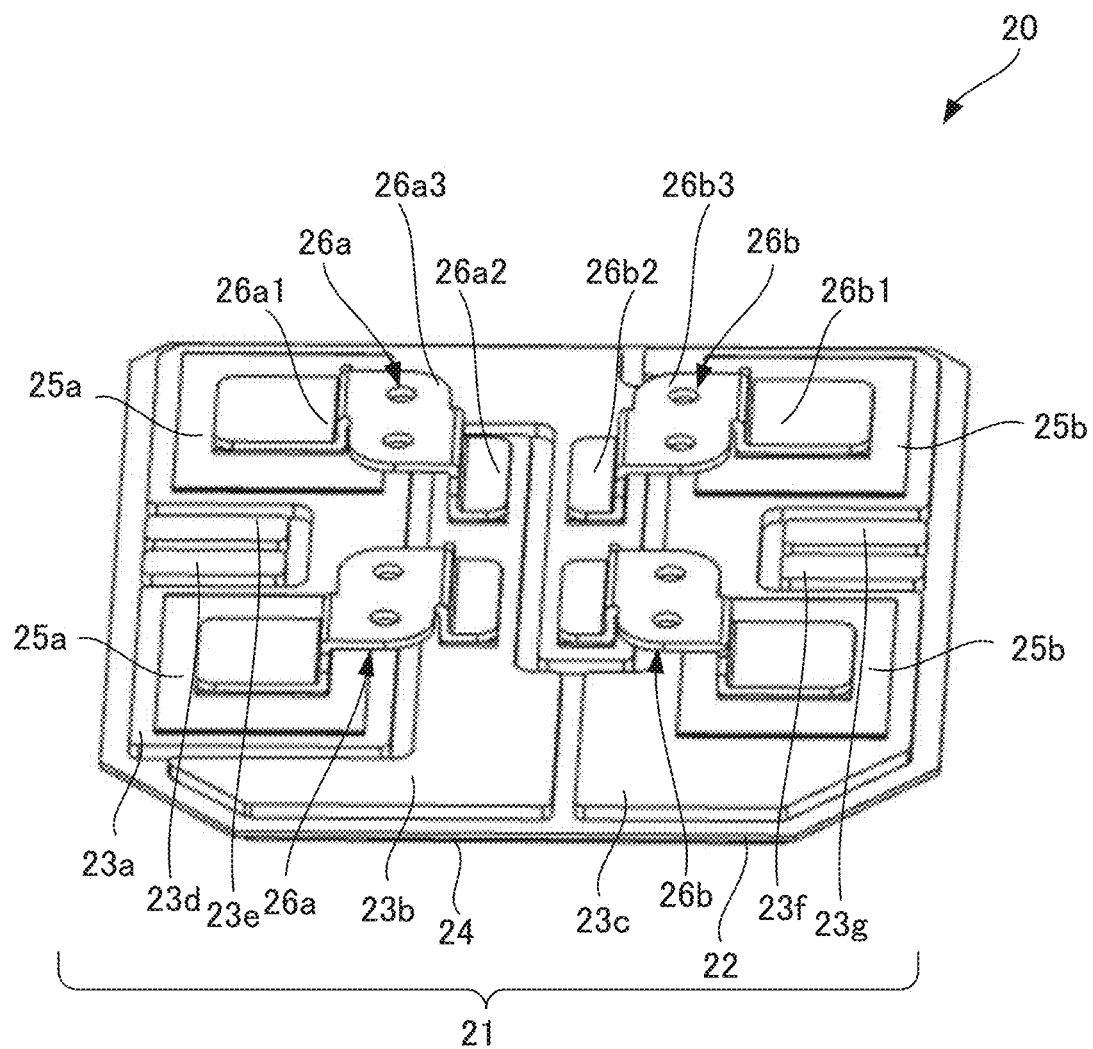
FIG. 4 is a perspective view of a semiconductor unit included in the semiconductor device according to the first embodiment.

Next, a manufacturing method of the semiconductor device 10 will be described with reference to FIG. 3. FIG. 3 is a flowchart illustrating a semiconductor device manufacturing method according to the first embodiment. First, a preparation step of preparing components needed to manufacture the semiconductor device 10 is performed (step S10 in FIG. 3). For example, the needed components are the semiconductor chips, ceramic circuit boards, the case 30, the sealing material, lead frames, the heat radiation plate 28, etc. Next, the semiconductor chips and the lead frames are bonded to predetermined locations of the ceramic circuit boards via bonding material. A semiconductor unit 20 prepared in this way will be described with reference to FIG. 4. FIG. 4 is a perspective view of a semiconductor unit included in the semiconductor device according to the first embodiment. This semiconductor unit 20 includes a ceramic circuit board 21 and semiconductor chips 25a and 25b and lead frames 26a and 26b disposed on the front surface of the ceramic circuit board 21 via bonding material 27 (see FIG. 11).

The ceramic circuit board 21 includes an insulating plate 22, a plurality of circuit patterns 23a, 23b, 23c, 23d, 23e, 23f, and 23g formed on the front surface of the insulating plate 22, and a metal plate 24 formed on the rear surface of the insulating plate 22. The insulating plate 22 and the metal plate 24 may have chamfered corners. The plurality of circuit patterns 23a, 23b, 23c, 23d, 23e, 23f, and 23g and the metal plate 24 each have an outline smaller than that of the insulating plate 22 in a plan view and are each formed on the inner side of the insulating plate 22. The insulating plate 22 has insulation properties and low thermal resistance and is made of material having excellent thermal conductivity. The insulating plate 22 is made of ceramic material such as aluminum oxide, aluminum nitride, or silicon nitride. The thickness of the insulating plate 22 is between 0.2 mm and 2.5 mm, inclusive.

The plurality of circuit patterns 23a, 23b, 23c, 23d, 23e, 23f, and 23g is made of material having excellent electrical conductivity. Examples of the material include copper, aluminum, and an alloy containing at least one kind of these elements. The thickness of each of the circuit patterns 23a, 23b, 23c, 23d, 23e, 23f, and 23g is preferably between 0.10 mm and 2.00 mm, inclusive, more preferably between 0.20 mm and 1.00 mm, inclusive. The circuit patterns 23a, 23b, 23c, 23d, 23e, 23f, and 23g, may be plated with material having excellent corrosion resistance. The material is, for example, nickel or an alloy containing nickel. The number, arrangement, and shapes of the circuit patterns 23a, 23b, 23c, 23d, 23e, 23f, and 23g illustrated in FIG. 4 are only examples. The number, arrangement, and shapes may be set suitably depending on the design.

The metal plate 24 is made of metal material having excellent thermal conductivity. Examples of the material include copper, aluminum, and an alloy containing at least one kind of these elements. The thickness of the metal plate 24 is preferably between 0.10 mm and 2.00 mm, inclusive, more preferably between 0.20 mm and 1.00 mm, inclusive. In addition, to improve the corrosion resistance, for example, the surface of the metal plate 24 may be plated with material such as nickel.

The semiconductor chips 25a and 25b are each a power device made of silicon, silicon carbide, or a gallium nitride. The semiconductor chips 25a and 25b are RC-IGBTs, as described above. The individual RC-IGBT is constituted by forming an IGBT, which is a switching element, and a free-wheeling diode (FWD), which is a diode element, in one chip. For example, these semiconductor chips 25a and 25b each include a collector electrode (a positive electrode) and an anode electrode as main electrodes on the rear surface and a gate electrode as a control electrode and an emitter electrode (a negative electrode) and a cathode electrode as main electrodes on the front surface. Regarding the semiconductor chips 25a (or the semiconductor chips 25b), an individual switching element and an individual diode element may be formed in separate chips. In this case, the individual switching element is a power MOSFET, an IGBT, or the like. In this case, the individual semiconductor chip 25a (or the individual semiconductor chip 25b) includes, for example, a drain electrode (a positive electrode or a collector electrode in the case of an IGBT) as a main electrode on the rear surface and a gate electrode as a control electrode and a source electrode (a negative electrode or an emitter electrode in the case of IGBT) as a main electrode on the front surface. The diode element is an FWD such as a Schottky barrier diode (SBD) or a P-intrinsic-N (PiN) diode. The individual semiconductor chip 25a (or the individual semiconductor chip 25b) includes a cathode electrode as a main electrode on the rear surface and an anode electrode as a main electrode on the front surface. The thickness of each of the semiconductor chips 25a and 25b is between 80 μm and 500 μm, inclusive. The thickness is, for example, 200 μm. FIG. 4 illustrates an example in which two semiconductor chips 25a form a lower arm and two semiconductor chips 25b form an upper arm on the ceramic circuit board 21. Other than this example, a plurality of sets of semiconductor chips may be disposed as needed, depending on the design.

The rear surface of each of the semiconductor chips 25a and 25b is bonded to a corresponding one of the circuit patterns 23a and 23c via the bonding material 27. The bonding material 27 is solder or sintered material. The solder is lead-free solder having a predetermined alloy as a main component. If the bonding is performed by sintering, the sintered material is, for example, powder of silver, iron, copper, aluminum, titanium, nickel, tungsten, or molybdenum.

The lead frames 26a and 26b are made of material having excellent electrical conductivity. Examples of the material include copper, aluminum, and an alloy containing at least one kind of these elements. The thickness of each of the lead frames 26a and 26b is preferably between 0.2 mm and 4.0 mm, inclusive, more preferably between 0.5 mm and 1.5 mm, inclusive. To improve the corrosion resistance, for example, the surfaces of the lead frames 26a and 26b may be plated with material such as nickel. The individual lead frame 26a is formed by integrally bonding a bonding part 26a1, a wiring part 26a3, and a bonding part 26a2. The individual lead frame 26b is formed by integrally bonding a bonding part 26b1, a wiring part 26b3, and a bonding part 26b2. The individual bonding part 26a1 is bonded to the negative electrode on the front surface of a corresponding semiconductor chip 25a via the bonding material 27. The individual bonding part 26b1 is bonded to the negative electrode on the front surface of a corresponding semiconductor chip 25b via the bonding material 27. The bonding parts 26a2 and 26b2 are bonded to the circuit pattern 23a and 23b via the bonding material 27. The wiring parts 26a3 and 26b3 electrically connect these bonding parts 26a1, 26a2, 26b1, and 26b2. The wiring parts 26a3 and 26b3 are located to be parallel to the front surface of the ceramic circuit board 21.

Figure 5:
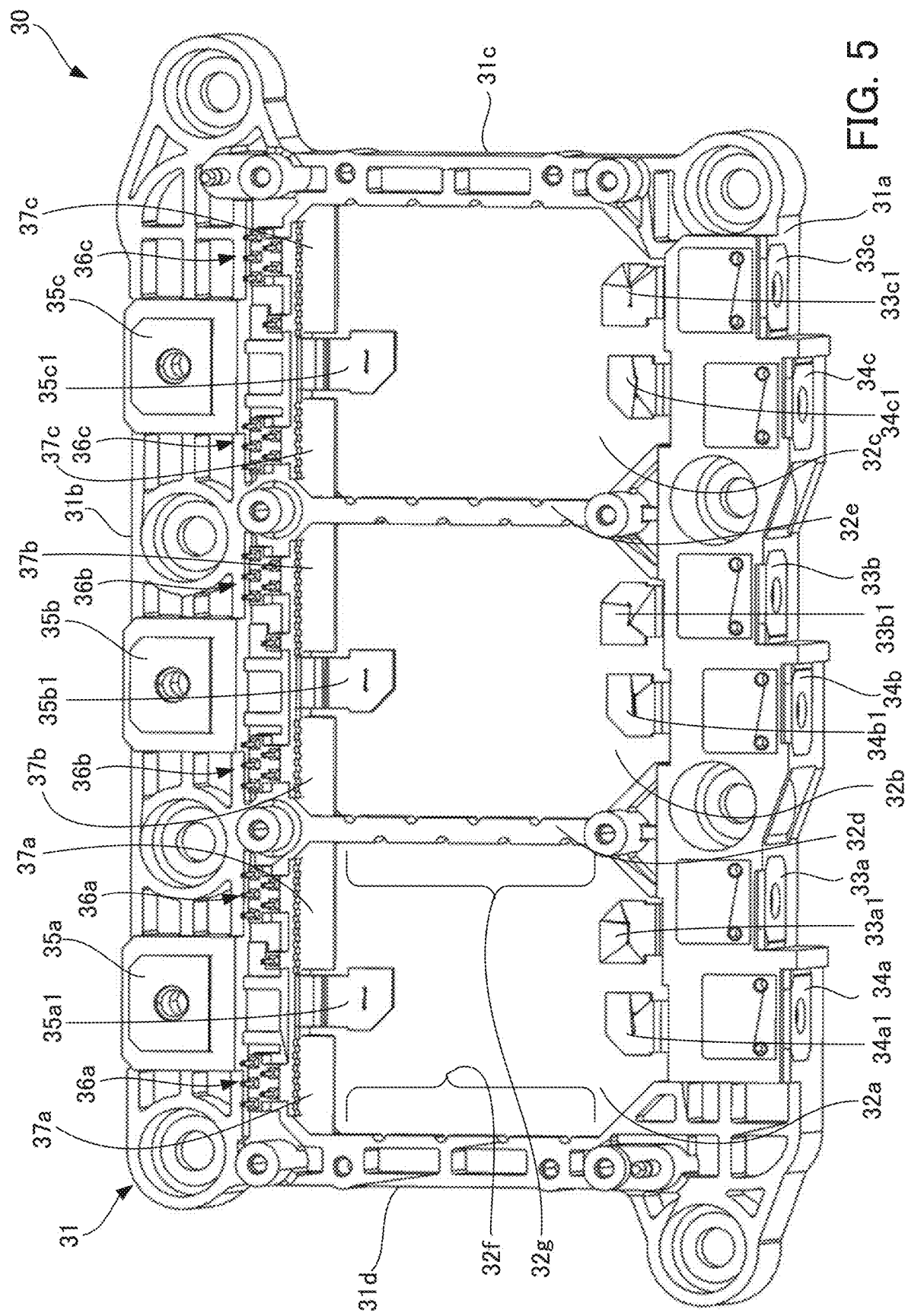
FIG. 5 is a plan view of a front surface of a case included in the semiconductor device according to the first embodiment.
Figure 6:
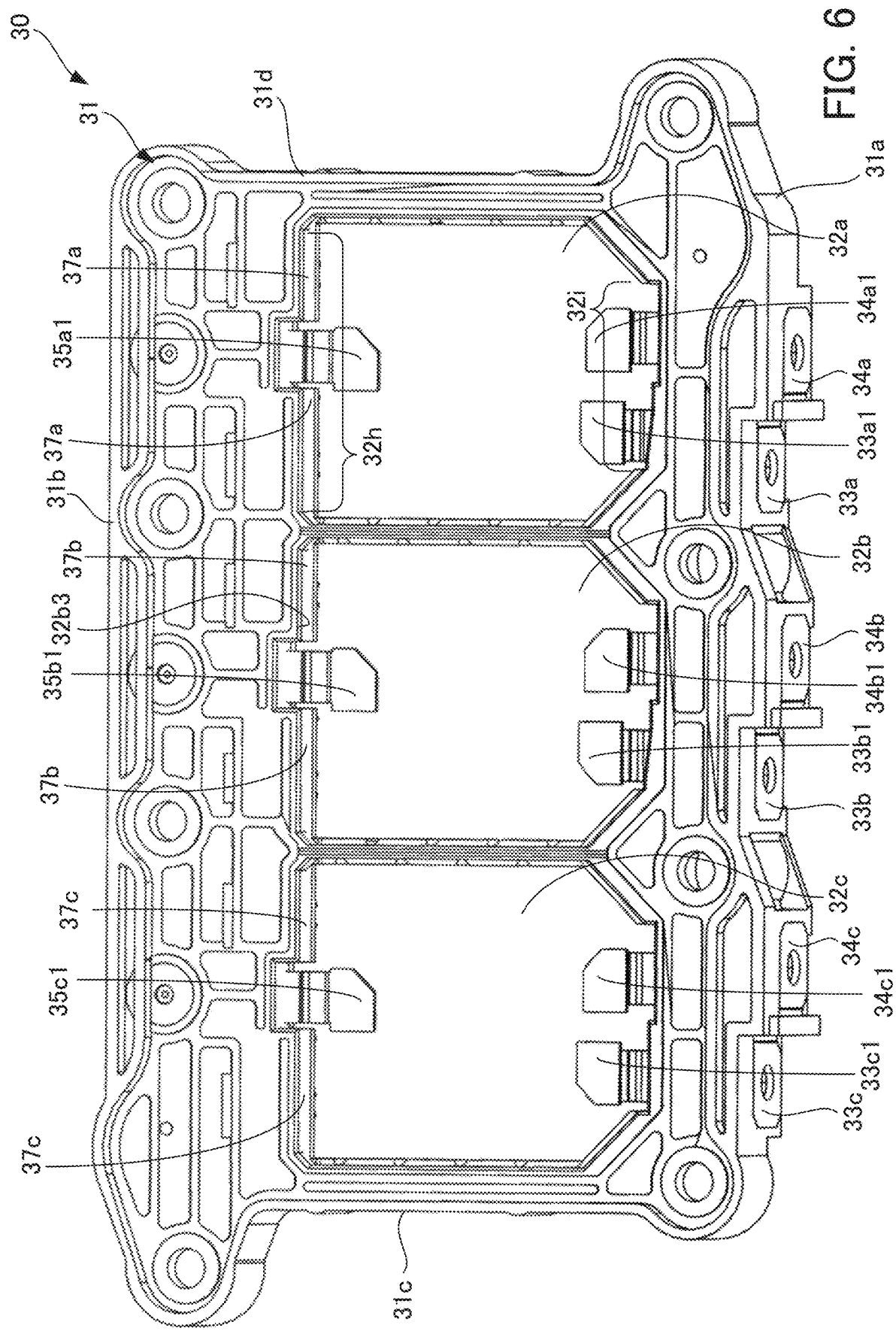
FIG. 6 is a plan view of a rear surface of the case included in the semiconductor device according to the first embodiment.

Next, the case 30 prepared in the preparation step will be described with reference to FIGS. 5 and 6. FIG. 5 is a plan view of the front surface of the case included in the semiconductor device according to the first embodiment. FIG. 6 is a plan view of the rear surface of the case included in the semiconductor device according to the first embodiment.

The case 30 is rectangular in a plan view and includes the frame part 31, which encloses the openings passing through the front surface to the rear surface of the case 30, the P terminals 33a, 33b, and 33c, the N terminals 34a, 34b, and 34c, the U, V, W terminals 35a, 35b, and 35c, the control terminals 36a, 36b, and 36c, and printed circuit boards 37a, 37b, and 37c attached to the frame part 31. The outline of the frame part 31 has a flat plate shape and includes the pair of opposite frame-part long sides 31a and 31b and the pair of opposite frame-part short sides 31c and 31d perpendicular to the frame-part long sides 31a and 31b. The frame part 31 has an opening between the inner wall surfaces of the frame-part long sides 31a and 31b and between the inner wall surfaces of the frame-part short sides 31c and 31d along the frame-part long sides 31a and 31b and the frame-part short sides 31c and 31d. That is, in a plan view, the opening has a rectangular shape perpendicular and parallel to the frame part 31. The frame part 31 includes the three storage parts 32a, 32b, and 32c along the frame-part long sides 31a and 31b, and these storage parts 32a, 32b, and 32c are formed by partitioning the opening by the partition parts 32d and 32e. In addition, the storage part 32a includes inner wall surfaces 32f and 32g (see FIG. 5) along its pair of opposite long sides and inner wall surfaces 32h and 32i (see FIG. 6) along its pair of opposite short sides being perpendicular to the inner wall surfaces 32f and 32g. While only the inner wall surfaces of the storage part 32a are denoted by reference characters, each of the storage parts 32b and 32c also includes inner wall surfaces 32f and 32g along its long sides and inner wall surfaces 32h and 32i along its short sides. Each of the shapes of the storage parts 32a, 32b, and 32c in a plan view corresponds to the shape of the ceramic circuit board 21 of the corresponding semiconductor unit 20. The storage parts 32a, 32b, and 32c according to the present embodiment have chamfered corners in a plan view. The inner wall surfaces 32i on which the P connection parts 33a1, 33b1, and 33c1 and the N connection parts 34a1, 34b1, and 34c1 are disposed are chamfered more largely than the inner wall surfaces 32h on which the printed circuit boards 37a, 37b, and 37c are disposed. That is, the length of the individual inner wall surface 32h is longer than the length of the individual inner wall surface 32i. Alternatively, each of the storage parts 32a, 32b, and 32c may be formed to have a substantially rectangular shape in a plan view.

The frame part 31 is formed by injection molding, that is, by setting the P terminals 33a, 33b, and 33c, the N terminals 34a, 34b, and 34c, the U, V, W terminals 35a, 35b, and 35c, the control terminals 36a, 36b, and 36c, and the printed circuit boards 37a, 37b, and 37c in a predetermined mold and injecting thermoplastic resin containing filler. Examples of the resin include polyphenylene sulfide (PPS) resin, polybutylene terephthalate (PBT) resin, polybutylene succinate (PBS) resin, polyamide (PA) resin, and acrylonitrile butadiene styrene (ABS) resin. The filler is silicon oxide, aluminum oxide, boron nitride, or aluminum nitride. In particular, PPS resin containing any one of the above kinds of filler is used for the frame part 31.

The P terminals 33a, 33b, and 33c are integrally formed along the frame-part long side 31a of the frame part 31 for the respective storage parts 32a, 32b, and 32c (inner wall surfaces 32i). The P terminals 33a, 33b, and 33c have the P connection parts 33a1, 33b1, and 33c1 at their respective ends. Each of the P connection parts 33a1, 33b1, and 33c1 has a flat plate shape and perpendicularly protrudes from the corresponding inner wall surface 32i into the corresponding one of the storage parts 32a, 32b, and 32c.

The N terminals 34a, 34b, and 34c are integrally formed along the frame-part long side 31a of the frame part 31 for their respective storage parts 32a, 32b, and 32c (inner wall surfaces 32i). The N terminals 34a, 34b, and 34c are adjacent to the P terminals 33a, 33b, and 33c, respectively. The N terminals 34a, 34b, and 34c protrude more outward than the P terminals 33a, 33b, and 33c. The N terminals 34a, 34b, and 34c have N connection parts 34a1, 34b1, and 34c1 at their respective ends. Each of the N connection parts 34a1, 34b1, and 34c1 has a flat plate shape and perpendicularly protrudes from the corresponding inner wall surface 32i into the corresponding one of the storage parts 32a, 32b, and 32c. The N connection parts 34a1, 34b1, and 34c1 are also adjacent to the P connection parts 33a1, 33b1, and 33c1, respectively.

The U, V, W terminals 35a, 35b, and 35c are integrally formed along the frame-part long side 31b on the front surface of the frame part 31 for their respective storage parts 32a, 32b, and 32c (inner wall surfaces 32h). The U, V, W terminals 35a, 35b, and 35c have U, V, W connection parts 35a1, 35b1, and 35c1 at their respective ends. Each of the U, V, W connection parts 35a1, 35b1, and 35c1 has a flat plate shape and perpendicularly protrudes from an approximately center part of the corresponding inner wall surface 32h into the corresponding one of the storage parts 32a, 32b, and 32c. In addition, the U, V, W terminals 35a, 35b, and 35c face the P connection parts 33a1, 33b1, and 33c1 and the N connection parts 34a1, 34b1, and 34c1 via the storage parts 32a, 32b, and 32c.

Each of the control terminals 36a, 36b, and 36c has a rod shape and has a circular or rectangular cross section. The control terminals 36a each have one end along and near the inner wall surface 32h of the storage part 32a on the front surface of the frame part 31. The control terminals 36b and 36c are configured in the same way along and near the inner wall surfaces 32h of the storage parts 32b and 32c on the front surface of the frame part 31. The control terminals 36a, 36b, and 36c extend upward. The other end of each of the control terminals 36a, 36b, and 36c is embedded in the case and electrically connected to the corresponding one of the printed circuit boards 37a, 37b, and 37c in the case.

The P terminals 33a, 33b, and 33c, the N terminals 34a, 34b, and 34c, the U, V, W terminals 35a, 35b, and 35c, and the control terminals 36a, 36b, and 36c are made of material having excellent electrical conductivity. Examples of the material include copper, aluminum, and an alloy containing at least one kind of these elements. The thickness of each of the P terminals 33a, 33b, and 33c, the N terminals 34a, 34b, and 34c, and the U, V, W terminals 35a, 35b, and 35c is preferably between 0.2 mm and 4.0 mm, inclusive, more preferably between 0.5 mm and 1.5 mm, inclusive. To improve the corrosion resistance, for example, the surfaces of the P terminals 33a, 33b, and 33c, the N terminals 34a, 34b, and 34c, the U, V, W terminals 35a, 35b, and 35c, and the control terminals 36a, 36b, and 36c may be plated with material such as nickel.

Each of the printed circuit boards 37a, 37b, and 37c has a flat plate shape. The printed circuit boards 37a, 37b, and 37c are disposed on the inner wall surfaces 32h near the U, V, W connection parts 35a1, 35b1, and 35c1, which are output terminals of the storage parts 32a, 32b, and 32c. In addition, the printed circuit boards 37a are formed on the inner wall surface 32h at either side of the U connection part 35a1, which is an output terminal, at corners of the storage part 32a. The printed circuit boards 37b are also formed on the inner wall surface 32h at either side of the V connection part 35b1 at corners of the storage part 32b. The printed circuit boards 37c are also formed on the inner wall surface 32h at either side of the W connection part 35c1 at corners of the storage part 32c. The printed circuit boards 37a, 37b, and 37c perpendicularly protrude from their respective inner wall surfaces 32h into the storage parts 32a, 32b, and 32c such that the rear surfaces of the printed circuit boards 37a, 37b, and 37c face the openings of the storage parts 32a, 32b, and 32c. In addition, the heights of the printed circuit boards 37a, 37b, and 37c from the rear surface of the case 30 (the sealing material 40a, 40b, and 40c) are lower than the heights of the U, V, W connection parts 35a1, 35b1, and 35c1 from the rear surface of the case 30 (sealing material 40a, 40b, and 40c). Specifically, the heights of the printed circuit boards 37a, 37b, and 37c are lower than the heights of the U, V, W connection parts 35a1, 35b1, and 35c1 in the thickness direction of the semiconductor chip 25a, 25b from the rear surface toward the front surface thereof.

Each of the printed circuit boards 37a, 37b, and 37c is formed by laminating an insulating layer and a circuit layer, which is made of conductive material and formed on the insulating layer. The insulating layer contains glass epoxy resin or phenol resin as a main component. The conductive material used for the circuit layer contains, for example, copper as a main component. The surfaces of these printed circuit boards 37a, 37b, and 37c are covered by resist film to improve the corrosion resistance, and a plurality of electrodes electrically connected to the circuit layer are arranged on the front surface. In addition, each of the printed circuit boards 37a, 37b, and 37c has a plurality of through-holes. The other end of each of the control terminals 36a, 36b, and 36c is inserted into an individual one of the through-holes. The control terminals 36a, 36b, and 36c are firmly fixed to the through-holes via solder and are electrically connected to the printed circuit boards 37a, 37b, and 37c. Alternatively, the control terminals 36a, 36b, and 36c may be press-fitted into the through-holes. The control terminals 36a, 36b, and 36c are inserted into the through-holes in the frame part 31. These printed circuit boards 37a, 37b, and 37c are also formed integrally with the frame part 31.

Next, a storage step of storing the semiconductor units 20 in the storage parts 32a, 32b, and 32c of the case 30 and electrically connecting the semiconductor units 20 to their respective terminals is performed (step S11 in FIG. 3). The semiconductor units 20 are disposed on the heat radiation plate 28 via the bonding material 27 such that the semiconductor units 20 correspond to their respective storage parts 32a, 32b, and 32c. The case 30 is disposed on the heat radiation plate 28 on which the semiconductor units 20 have been disposed such that the semiconductor units 20 are stored in their respective storage parts 32a, 32b, and 32c. The case 30 is bonded to the heat radiation plate 28 via adhesive 39 (see FIG. 11).

In the semiconductor unit 20 stored in the storage part 32a, the semiconductor chips 25a and 25b are separated from the inner wall surfaces constituting the storage part 32a toward the center of the storage part 32a. In addition, the semiconductor chips 25a and 25b are separated from the inner wall surface 32h, on which the printed circuit boards 37a are formed, toward the center of the storage part 32a. In the semiconductor units 20 stored in the storage parts 32b and 32c, the semiconductor chips 25a and 25b are also separated from the inner wall surfaces constituting the storage parts 32b and 32c toward the centers of the storage parts 32b and 32c.

In the semiconductor unit 20 stored in the storage part 32a, the N connection part 34a1 is electrically connected to the circuit pattern 23b via a block part 29. The P connection part 33a1 is electrically connected to the circuit pattern 23c via a block part 29. In addition, the U connection part 35a1 is electrically connected to the circuit pattern 23a via a block part 29. Likewise, in the semiconductor unit 20 stored in the storage part 32b, the N connection part 34b1 is electrically connected to the circuit pattern 23b via a block part 29. The P connection part 33b1 is electrically connected to the circuit pattern 23c via a block part 29. In addition, the V connection part 35b1 is electrically connected to the circuit pattern 23a via a block part 29 (see FIGS. 8 and 11). Likewise, in the semiconductor unit 20 stored in the storage part 32c, the N connection part 34c1 is electrically connected to the circuit pattern 23b via a block part 29. The P connection part 33c1 is electrically connected to the circuit pattern 23c via a block part 29. In addition, the W connection part 35c1 is electrically connected to the circuit pattern 23a via a block part 29. The rear surface of each block part 29 may be previously bonded to a predetermined circuit pattern 23a or 23c via bonding material such as solder or sintered metal. In addition, the block parts 29 may be bonded to the individual terminals, namely, the P connection parts 33a1, 33b1, and 33c1, the N connection parts 34a1, 34b1, and 34c1, and the U, V, W connection parts 35a1, 35b1, and 35c1, via bonding material such as solder or sintered metal. Alternatively, the individual block parts 29 may directly be bonded to the individual terminals, namely, the P connection parts 33a1, 33b1, and 33c1, the N connection parts 34a1, 34b1, and 34c1, and the U, V, W connection parts 35a1, 35b1, and 35c1, via laser or the like. The block parts 29 are made of material having excellent electrical conductivity. Examples of the material include copper, aluminum, and an alloy containing at least one kind of these elements. The thickness of an individual block part 29 corresponds to the gap between the corresponding connection part and the corresponding circuit pattern. To improve the corrosion resistance, for example, the surface of the individual block part 29 may be plated with material such as nickel.

Figure 7:
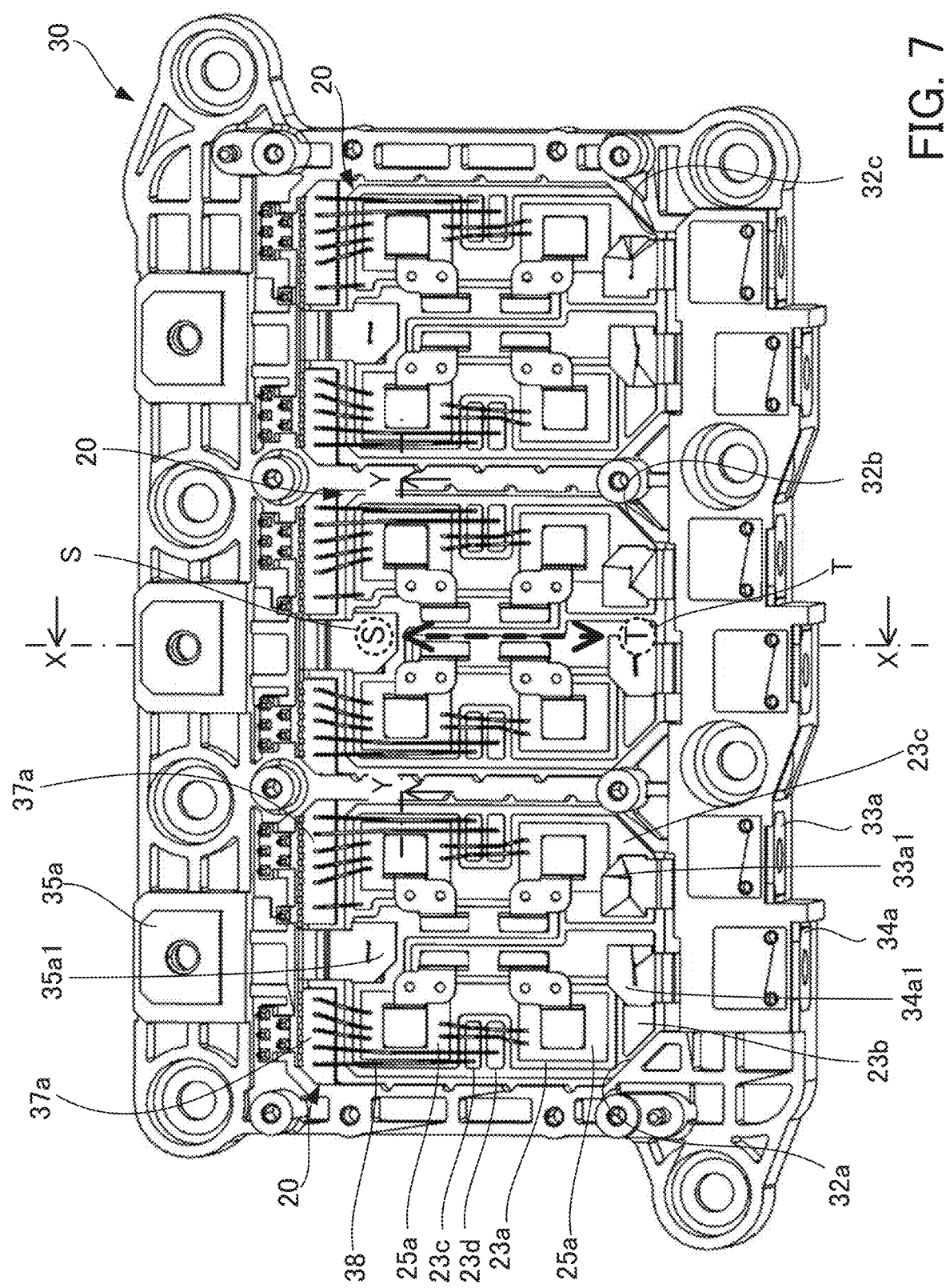
FIG. 7 illustrates a wiring step included in the semiconductor device manufacturing method according to the first embodiment.

Next, a wiring step of wiring the semiconductor units 20 and the printed circuit boards 37a, 37b, and 37c stored in the case 30 with bonding wires is performed (step S12 in FIG. 3). This wiring step will be described with reference to FIG. 7. FIG. 7 illustrates a wiring step included in the semiconductor device manufacturing method according to the first embodiment. In the storage part 32a of the case 30 in which a semiconductor unit 20 is stored in step S11, a printed circuit board 37a and the gate electrodes of the semiconductor chips 25a are electrically connected to each other via bonding wires 38. In addition, a printed circuit board 37a and the gate electrodes of the semiconductor chips 25b are electrically connected to each other via bonding wires 38. Likewise, in the storage part 32b of the case 30 in which a semiconductor unit 20 is stored, a printed circuit board 37b and the gate electrodes of the semiconductor chips 25a are electrically connected to each other via bonding wires 38. In addition, a printed circuit boards 37b and the gate electrodes of the semiconductor chips 25b are electrically connected to each other via bonding wires 38. Likewise, in the storage part 32c of the case 30 in which a semiconductor unit 20 is stored, a printed circuit board 37c and the gate electrodes of the semiconductor chips 25a are electrically connected to each other via bonding wires 38. In addition, a printed circuit board 37c and the gate electrodes of the semiconductor chips 25b are electrically connected to each other via bonding wires 38.

Figure 8:
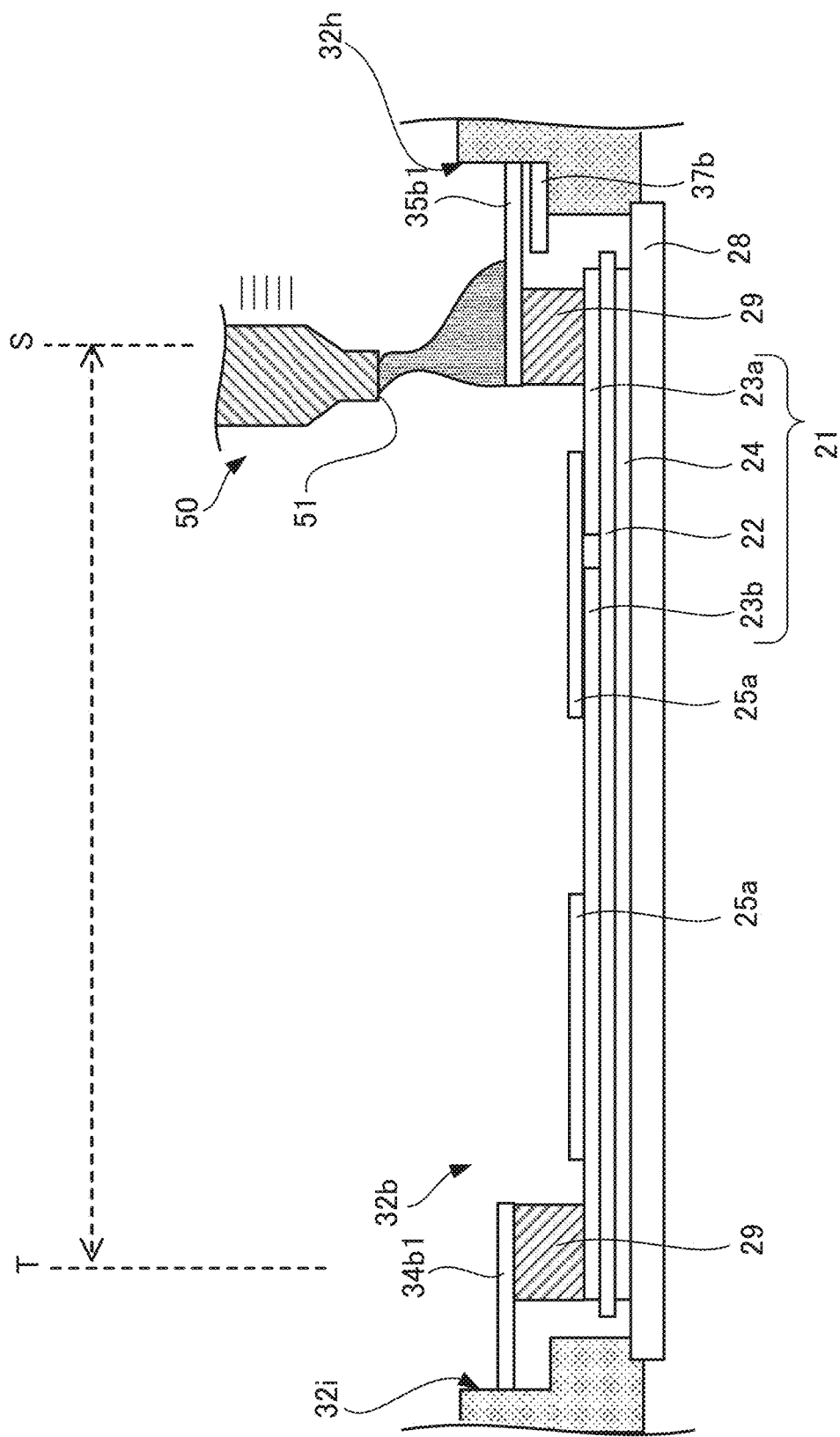
FIG. 8 illustrates a sealing step included in the semiconductor device manufacturing method according to the first embodiment.

Next, a sealing step of sealing the storage parts 32a, 32b, and 32c of the case 30 with sealing material is performed (step S13 in FIG. 3). This sealing step will be described with reference to FIGS. 8 and 7. FIG. 8 illustrates a sealing step included in the semiconductor device manufacturing method according to the first embodiment. FIG. 8 is a sectional view taken along a dashed-dotted line X-X in FIG. 7. The lead frames 26a and 26b and the bonding wires 38 are not illustrated in FIG. 8. While FIG. 8 illustrates a case in which the storage part 32b is sealed, the storage parts 32a and 32c are sealed in the same way.

A sealing apparatus is used to seal the storage parts 32a, 32b, and 32c of the case 30. The sealing apparatus includes, for example, a dispenser that discharges sealing material from its discharge port and a control device (for example, a central processing unit (CPU)) that controls the traveling speed of the dispenser and the sealing material discharge amount per unit time, for example. Liquid thermosetting resin may be used as the sealing material. The viscosity of the material is between 1000 mPa·s and 70000 mPa·s, inclusive. Two-component resin containing base resin and hardener may be used as the sealing material. For example, epoxy resin may be used as the base resin, and polyamine hardener, acid anhydride hardener, phenolic hardener, or thiol hardener may be used as the hardener. For example, the dispenser supplies the base resin and the hardener from separate tubes into a single syringe and discharges the mixture. For example, when the storage part 32b is sealed, the control device causes the dispenser 50 to reciprocate between a starting location ("S") and a turn-around location ("T") illustrated in FIGS. 7 and 8 while causing the dispenser to discharge the melted sealing material from the discharge port 51. The dispenser 50 reciprocates between "S" and "T" along the same scanning path indicated by a dashed arrow in FIGS. 7 and 8. The starting location "S" is above the V connection part 35b1 of the V terminal 35b. In the case of the storage parts 32a and 32c, the starting location "S" is above the U connection part 35a1 of the U terminal 35a and is above the W connection parts 35c1 of the W terminal 35c. In addition, the turn-around location "T" is located on the opposite side of "S" beyond the storage parts 32a, 32b, and 32c.

The sealing apparatus is able to cause the dispenser 50 to discharge the sealing material from the discharge port 51 while changing the discharge amount per unit time. Alternatively, the sealing apparatus is able to freely control the scanning (traveling) speed of the dispenser 50. After the wiring step in step S12, when the case 30 in which the semiconductor units 20 are stored is set in the sealing apparatus, the dispenser 50 discharges sealing material from the discharge port 51 to the storage parts 32a, 32b, and 32c. The base resin and the hardener of the sealing material discharged to the storage parts 32a, 32b, and 32c reacts and cures. As a result, the storage parts 32a, 32b, and 32c are sealed with the sealing material 40a, 40b, and 40c, and the semiconductor device 10 illustrated in FIG. 1 is obtained. As needed, the semiconductor device 10 may be heated to accelerate the curing.

Figure 9:
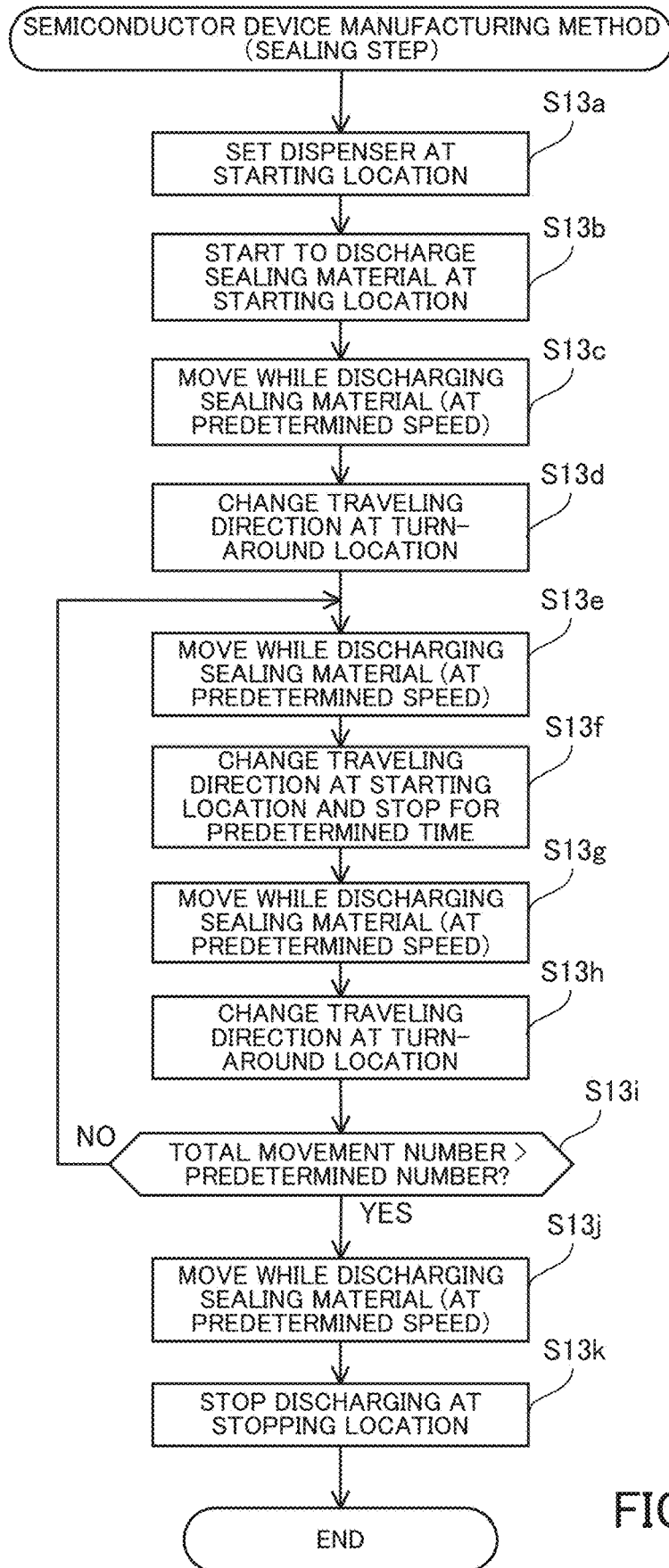
FIG. 9 is a flowchart illustrating the sealing step included in the semiconductor device manufacturing method according to the first embodiment.
Figure 10A:
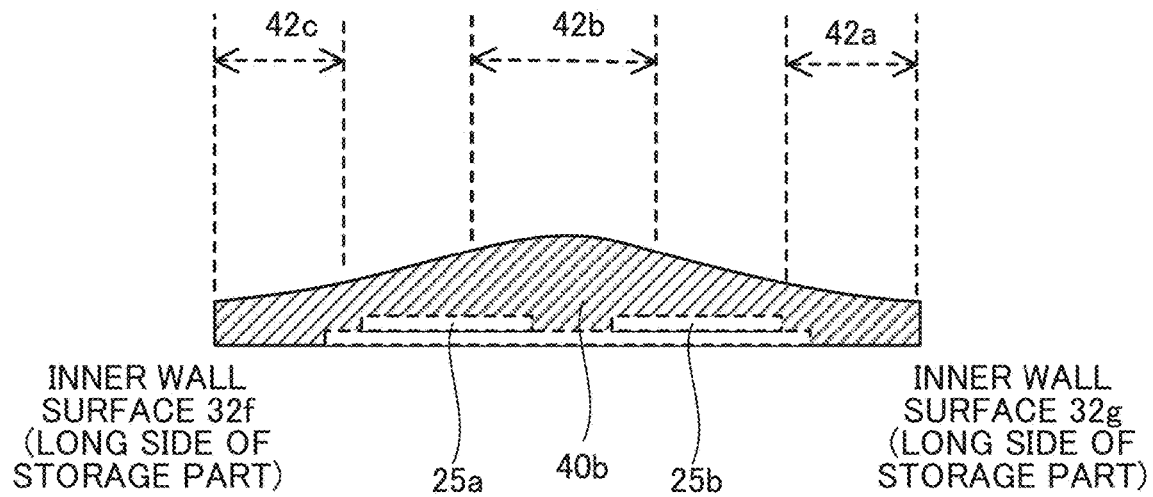
FIGS. 10A and 10B illustrate sealing material included in the semiconductor device according to the first embodiment (part 1)
Figure 10B:
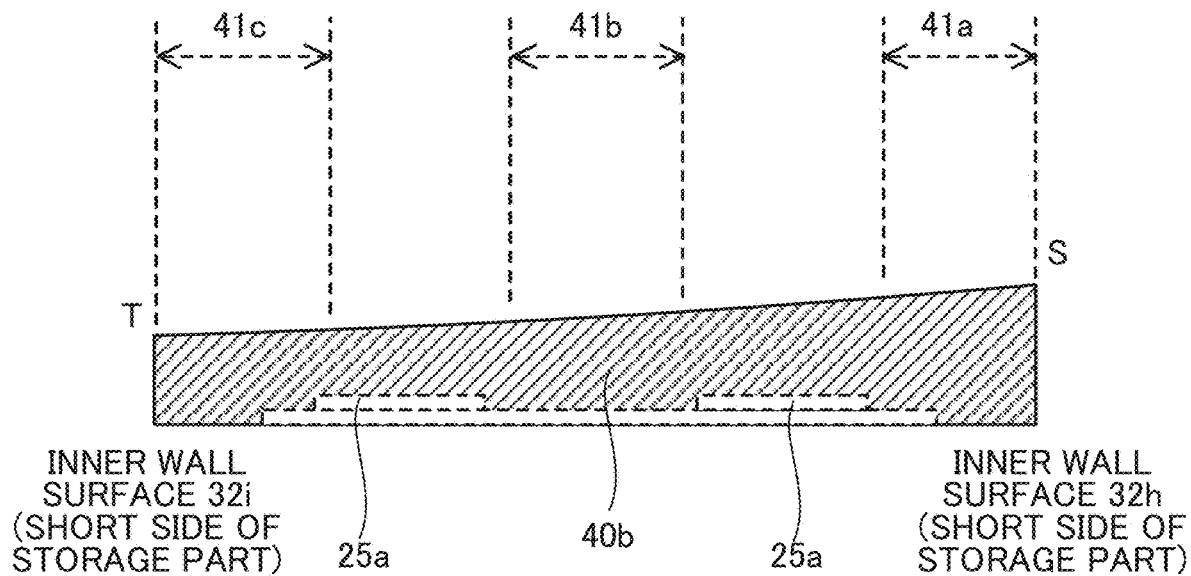

Next, the sealing step in step S13 in FIG. 3 will be described in detail with reference to FIGS. 9 to 11 and FIGS. 7 and 8. FIG. 9 is a flowchart illustrating the sealing step included in the semiconductor device manufacturing method according to the first embodiment. FIGS. 10A, 10B, and 11 illustrate sealing material included in the semiconductor device according to the first embodiment. While FIG. 9 illustrates the sealing step performed on the storage part 32b, the same sealing step is also performed on the storage parts 32a and 32c. In addition, since FIGS. 10A, 10B, and 11 are drawings for illustrating the shape of the sealing material 40b discharged into the storage part 32b, only the parts of the semiconductor unit 20 that are needed to determine the shape of the sealing material 40b are illustrated in FIGS. 10A, 10B, and 11. FIG. 10A is a sectional view of the sealing material 40b in the storage part 32b, taken along a dashed-dotted line Y-Y in FIG. 7. FIG. 10B is a sectional view of the sealing material 40b in the storage part 32b, taken along a dashed-dotted line X-X in FIG. 7. While FIGS. 10A and 10B illustrate the sealing material 40b, the same applies to the sealing material 40a and 40c. In addition, the long-side areas 42a and 42c and the intermediate area 42b illustrated in FIG. 1 are indicated in FIG. 10A. In addition, the output-side area 41a, the intermediate area 41b, and the input-side area 41c illustrated in FIG. 1 are indicated in FIGS. 10B and 11. FIG. 11 is an enlarged view of the right side in FIG. 10B.

As illustrated in FIGS. 7 and 8, first, the dispenser 50 is set at the starting location ("S") beside the inner wall surface 32h of the storage part 32b (step S13a in FIG. 9). For example, the starting location ("S") may be above the printed circuit boards 37b (and the V connection part 35b1), in a side view seen from the inner wall surface 32g (a long side of the storage part 32b) parallel to the traveling direction of the dispenser 50, as illustrated in FIG. 8. In this state, the discharge port 51 of the dispenser 50 faces the semiconductor unit 20. Next, the dispenser 50 set at "S" starts to discharge melted sealing material from the discharge port 51 (step S13b in FIG. 9). The discharge amount per unit time of the sealing material discharged from the discharge port 51 is, for example, between 0.5 ml/sec and 4.0 ml/sec, inclusive. Next, while discharging the sealing material, the dispenser 50 moves at a predetermined speed from "S" to the turn-around location ("T") (step S13c in FIG. 9). For example, the turn-around location ("T") may be above the N connection part 34b1 (and the P connection part 33b1) extending from the side surface opposite to the printed circuit boards 37b, in a side view from the long side of the storage part 32b, as illustrated in FIG. 8. In this case, the predetermined speed is, for example, between 0.5 cm/sec and 4.0 cm/sec, inclusive. Next, when the dispenser 50 reaches "T", the dispenser 50 changes its traveling direction to the "S" direction (step S13d in FIG. 9). At this point, the control device of the sealing apparatus increments the movement number of the dispenser 50 between "S" and "T" by 1. The movement number between "S" and "T" is incremented by 1 each time the dispenser 50 has moved from "S" to or from "T" to "S". Next, while discharging the sealing material, the dispenser 50 moves from "T" to "S" at a predetermined speed (step S13e in FIG. 9). The predetermined speed may be the same as the speed at which the dispenser 50 moves from "S" to "T", that is, between 0.5 cm/sec and 4.0 cm/sec, inclusive.

Next, when the dispenser 50 reaches "S", the dispenser 50 changes its traveling direction to the "T" direction and stops for a predetermined time (step S13f in FIG. 9). At this point, the control device of the sealing apparatus increments the movement number of the dispenser 50 between "S" and "T" by 1. The dispenser 50 continuously discharges the sealing material from the discharge port 51 while stopping at "S" for the predetermined time. The predetermined time is between 0.5 seconds and 2.0 seconds, inclusive. Thus, more sealing material is discharged around "S" than in the other areas in the storage part 32b. Next, while discharging the sealing material, the dispenser 50 moves from "S" to "T" at the predetermined speed (step S13g in FIG. 9).

Next, when the dispenser 50 reaches "T", the dispenser 50 changes its traveling direction to the "S" direction (step S13h in FIG. 9). At this point, the control device of the sealing apparatus increments the movement number of the dispenser 50 between "S" and "T" by 1. Next, the control device determines whether the total movement number is over a predetermined number (step S13i in FIG. 9). If the total movement number is equal to or less than the predetermined number (the total movement number is not over the predetermined number), step S13e is performed again. In this way, the dispenser 50 reciprocates between "S" and "T". If the total movement number is over the predetermined number, step S13j is performed. The total movement number is set between 4 and 10, inclusive. That is, the control device causes the dispenser 50 to make two to five round trips between "S" and "T".

Next, while discharging the sealing material, the dispenser 50 moves from "T" to "S" at a predetermined speed (step S13j in FIG. 9). Next, when the dispenser 50 reaches a stopping location, the dispenser 50 stops at the stopping location and stops discharging the sealing material (step S13k in FIG. 9). This stopping location may be "S" or any location between "S" and "T". Next, when the sealing material is solidified, the storage part 32b is sealed with the sealing material 40b. The storage parts 32a and 32c are sealed with the sealing material 40a and 40c in the same way, respectively.

Regarding the sealing material 40b sealing the storage part 32b, in a side view seen from the inner wall surface 32i or the inner wall surface 32h perpendicular to the traveling direction of the dispenser 50 (the frame-part short side 31c or 31d), as illustrated in FIG. 10A, the height of the sealing material 40b in the intermediate area 42b from the bottom surface is higher than the heights of the sealing material 40b in the long-side areas 42a and 42c from the bottom surface. Specifically, the height in the intermediate area 42b is higher than the heights in the long-side areas 42a and 42c in the thickness direction of the semiconductor chip 25a, 25b from the rear surface toward the front surface thereof. When the dispenser 50 discharges the sealing material 40b to the storage part 32b, the dispenser 50 discharges the sealing material to the intermediate area 42b while reciprocating above the intermediate area 42b along the inner wall surfaces 32f and 32g. Thus, the sealing material discharged to the intermediate area 42b flows to the long-side areas 42a and 42c located both sides of the intermediate area 42b. By repeating this, more sealing material is discharged to the intermediate area 42b than to the long-side areas 42a and 42c. The solidified sealing material 40b in the intermediate area 42b is thicker than the solidified sealing material 40b in the long-side areas 42a and 42c and is monotonously thinned toward the long-side areas 42a and 42c.

In addition, in a side view seen from the inner wall surface 32f or the inner wall surface 32g (a long side of the storage part 32b) parallel to the traveling direction of the dispenser 50, as illustrated in FIG. 10B, the height of the sealing material 40b sealing the storage part 32b in the output-side area 41a from the bottom surface is higher than the height of the sealing material 40b in the intermediate area 41b from the bottom surface. Specifically, the height in the output-side area 41a is higher than the height in the intermediate area 41b in the thickness direction of the semiconductor chip 25a, 25b from the rear surface toward the front surface thereof. In addition, the height of the sealing material 40b in the intermediate area 41b from the bottom surface is equal to or higher than the height of the sealing material 40b in the input-side area 41c from the bottom surface. Specifically, the height in the intermediate area 41b is equal to or higher than the height in the input-side area 41c in the thick direction of the semiconductor chip 25a, 25b from the rear surface toward the front surface thereof. As described above, when the dispenser 50 discharges the sealing material 40b to the storage part 32b, the dispenser 50 discharges the sealing material to the intermediate area 42b while reciprocating above the intermediate area 42b (FIG. 10A) along the inner wall surfaces 32f and 32g. In this case, when the dispenser 50 changes its traveling direction in the output-side area 41a including the starting location ("S"), the dispenser 50 stops at this location for a predetermined time. However, when the dispenser 50 changes its traveling direction in the input-side area 41c including the turn-around location ("T"), the dispenser 50 moves toward "S" without stopping. By repeating this, more sealing material is discharged in the output-side area 41a than in the intermediate area 41b. In addition, the amount of sealing material in the intermediate area 41b is equal to or more than that in the input-side area 41c. The thickness (volume) of the solidified sealing material 40b gradually decreases from the output-side area 41a to the input-side area 41c and is monotonously thinned from the output-side area 41a to the intermediate area 41b. The solidified sealing material 40b has the same height from the intermediate area 41b to the input-side area 41c or monotonously slopes from the intermediate area 41b to the input-side area 41c.

The dispenser 50 may be configured to have different discharge amounts of sealing material 40b per unit time at different locations such that the different locations have different thicknesses. For example, when the dispenser 50 is reciprocated at a certain speed above the intermediate area 42b (FIG. 10A) along the inner wall surfaces 32f and 32g, the dispenser 50 may discharge more sealing material 40b per unit time in the output-side area 41a and discharge less and less sealing material 40b per unit time as the dispenser 50 moves from the intermediate area 41b to the input-side area 41c. In this way, the sealing material 40b illustrated in FIG. 10B is obtained. Alternatively, the dispenser 50 may be configured to move at different traveling speeds at different locations such that the sealing material 40b have different thicknesses at the different locations. For example, when the dispenser 50 is reciprocated above the intermediate area 42b (FIG. 10A) along the inner wall surfaces 32f and 32g, the dispenser 50 may be configured to move at a low traveling speed in the output-side area 41a, at a high traveling speed in the intermediate area 41b, and at a higher traveling speed in the input-side area 41c. In this case, the dispenser 50 has a certain discharge amount per unit time. In this way, too, the sealing material 40b illustrated in FIG. 10B is obtained.

In addition, the printed circuit boards 37a, 37b, and 37c are disposed in the storage parts 32a, 32b, and 32c according to the present embodiment in a plan view. The storage parts 32a, 32b, and 32c have chamfered corners on the inner wall surfaces 32h. Thus, compared with an inner wall surface 32h of a rectangular storage part without chamfered corners, thicker sealing material 40b is formed in the output-side area 41a. For example, the length of the individual inner wall surface 32h may be 80% and 99%, inclusive, of the length of an inner wall surface 32h of a rectangular storage part without chamfered corners. Thus, according to the present embodiment, compared with a rectangular storage part without chamfered corners on an inner wall surface 32h, thicker sealing material 40b is formed in the output-side area 41a.

As illustrated in FIG. 11, in the output-side area 41a in which the sealing material 40b is formed as described above, the sealing material 40b seals an upper inner wall surface 32h1 included in the inner wall surface 32h of the case 30, the front surface of the V connection part 35b1, and the front surface of the printed circuit boards 37b on a step part 32h2 included in the inner wall surface 32h of the case 30. The sealing material 40b also penetrates into the side parts of the ceramic circuit board 21. In addition, the sealing material 40b tightly penetrates into the area between the lower part of the V connection part 35b1 and the printed circuit boards 37b and a lower inner wall surface 32h3 included in the inner wall surface 32h of the case 30.

When the semiconductor unit 20 stored in the storage part 32b of the case 30 is sealed with sealing material, it is conventionally difficult to have sealing material penetrate into the area between the rear surface of the individual printed circuit board 37b and the lower inner wall surface 32h3. Thus, voids are formed easily in this area. The reason is as follows. When sealing material is discharged around the inner wall surface 32h of the storage part 32b, first, the V connection part 35b1 disposed on a center part of the inner wall surface 32h is sealed. However, the printed circuit boards 37b are disposed on both sides of the V connection part 35b1 and below the level of the V connection part 35b1. Thus, since the area between the rear surfaces of the printed circuit boards 37b and the lower inner wall surface 32h3 is the last area that the sealing resin reaches, voids are formed easily in this area. As described above, in the above sealing step, more sealing material is discharged around the starting location ("S") than in the other areas. Thus, the sealing material is allowed to sufficiently penetrate into the area between the rear surfaces of the printed circuit boards 37b and the lower inner wall surface 32h3, the area into which the sealing material has not easily penetrated conventionally.

In addition, the sealing material 40b in the intermediate area 41b seals the lead frames 26a, the semiconductor chips 25a, etc. on the front surface of the ceramic circuit board 21. In the intermediate area 41b, a distance H1 from the front surface of the wiring part 26a3 of the individual lead frame 26a to the sealing surface of the sealing material 40b is between 0.5 mm and 4.0 mm, inclusive. In addition, the sealing surface of the sealing material 40b in the output-side area 41a is located at the level corresponding to the distance H1+a distance H2. The distance H2 is between 0.5 mm and 4.0 mm, inclusive. The semiconductor unit 20 stored in the storage part 32b as described above is securely sealed from the front surface. While not illustrated, the input-side area 41c is also sealed with the sealing material 40b in the same way.

The above semiconductor device 10 includes the semiconductor chips 25a and 25b, each of which has a main electrode on a front surface, and the ceramic circuit boards 21, each of which has the insulating plate 22 and the circuit patterns 23a and 23c which are formed on the front surface of the insulating plate 22 and on which the rear surfaces of the semiconductor chips 25a and 25b are disposed. The semiconductor device 10 includes the case 30 having the frame part 31 having rectangular openings in a plan view and the storage parts 32a, 32b, and 32c, each of which has four sides enclosed by inner wall surfaces of the frame part 31 and in which the corresponding ceramic circuit board 21 is stored. The case 30 also has the printed circuit boards 37a, 37b, and 37c, each of which has a flat plate shape and protrudes from the corresponding inner wall surface 32h toward the corresponding one of the storage parts 32a, 32b, and 32c. In addition, the semiconductor device 10 includes the sealing material 40a, 40b, and 40c, which is discharged to the storage parts 32a, 32b, and 32c and seal the semiconductor chips 25a and 25b and the printed circuit boards 37a, 37b, and 37c. The heights of the sealing surfaces of the sealing materials 40a, 40b, and 40c around the printed circuit boards 37a, 37b, and 37c, the sealing surfaces being the front surfaces of the printed circuit boards 37a, 37b, and 37c, from the rear surfaces of the sealing material 40a, 40b, and 40c, are higher than the heights of the sealing surfaces of the sealing material around the semiconductor chips 25a and 25b. Specifically, the heights of the sealing material 40a, 40b, and 40c are higher around the printed circuit boards 37a, 37b, and 37c than around the semiconductor chips 25a and 25b in the thickness direction of the semiconductor chip 25a, 25b from the rear surface toward the front surface thereof. In this way, the sealing materials 40a, 40b, and 40c penetrate into the storage parts 32a, 32b, and 32c, and the semiconductor chips 25a and 25b and the printed circuit boards 37a, 37b, and 37c are suitably sealed. Thus, occurrence of voids, etc. in the sealing materials 40a, 40b, and 40c is prevented. In addition, to achieve this sealing, only the sealing material 40a, 40b, and 40c around the printed circuit boards 37a, 37b, and 37c are made thicker. The sealing materials 40a, 40b, and 40c are not made thicker as a whole. Thus, even when the semiconductor device 10 undergoes thermal deformation, increase of the thermal stress on the whole semiconductor device 10 is prevented constantly. As a result, deterioration of the reliability of the semiconductor device 10 is prevented.

Second Embodiment

Figure 12:
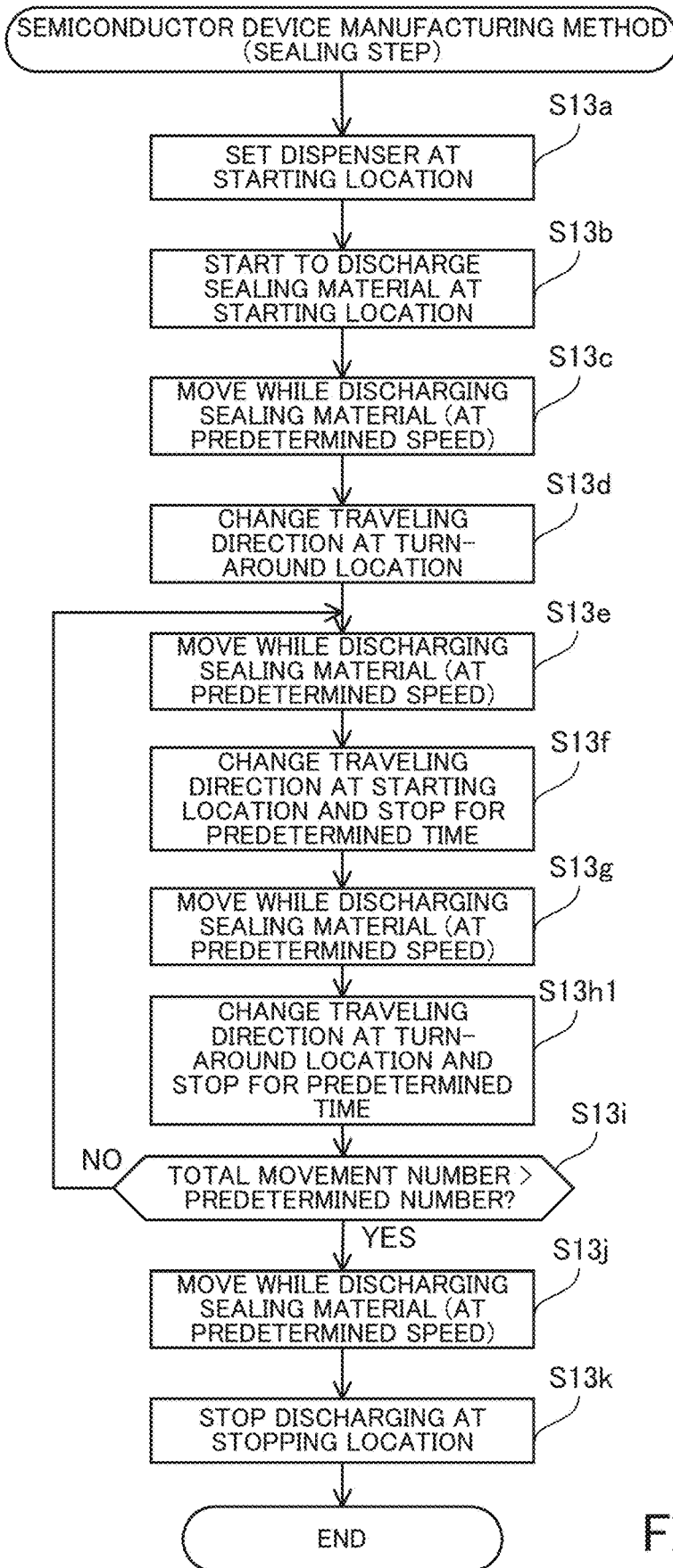
FIG. 12 is a flowchart illustrating a sealing step included in a semiconductor device manufacturing method according to a second embodiment.
Figure 13:
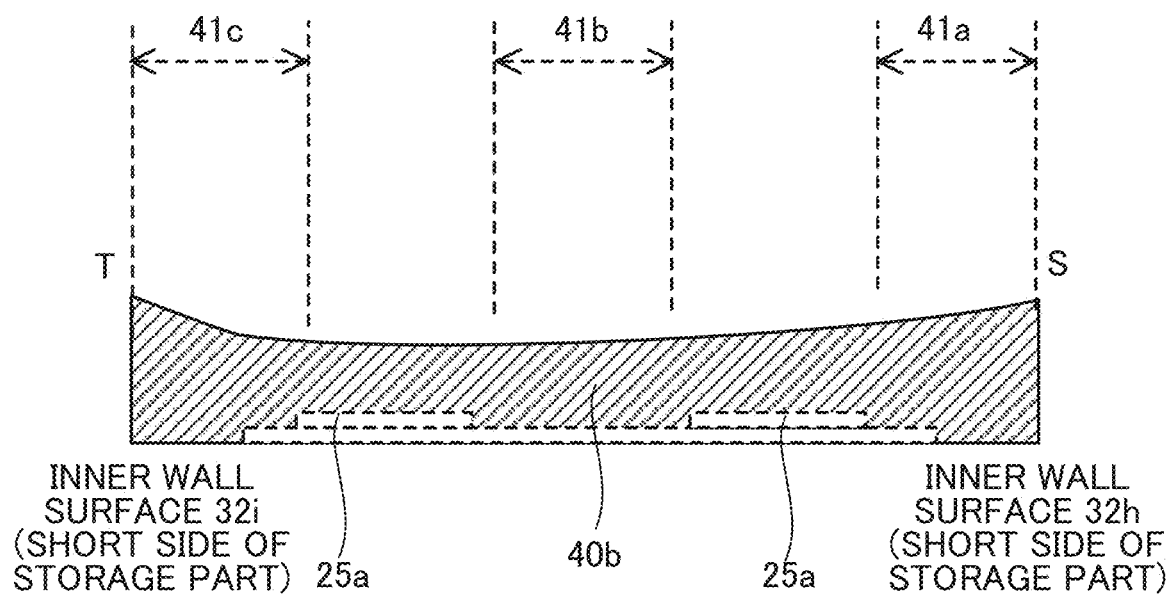
FIG. 13 illustrates the sealing step included in the semiconductor device manufacturing method according to the second embodiment.

According to a second embodiment, a sealing step different from that according to the first embodiment is performed. This sealing step will be described with reference to FIGS. 12 and 13. A semiconductor device 10 (not illustrated) according to the second embodiment has the same configuration as that of the semiconductor device 10 according to the first embodiment, except that the shape of the sealing material 40a, 40b, and 40c. FIG. 12 is a flowchart illustrating the sealing step included in a semiconductor device manufacturing method according to the second embodiment. FIG. 13 illustrates the sealing step included in the semiconductor device manufacturing method according to the second embodiment. FIG. 13 corresponds to FIG. 10B. That is to say, the illustration of the sealing material 40b sealing the storage part 32b is a side view seen from the inner wall surface 32f or the inner wall surface 32g (a long side of the storage part 32b) parallel to the traveling direction of the dispenser 50.

Step S13h1 in the flowchart in FIG. 12 is performed instead of step S13h in the flowchart in FIG. 9. That is to say, after the dispenser 50 moves at a predetermined speed from "S" to "T" and reaches "T" while discharging the sealing material in step S13g, the dispenser 50 changes its traveling direction to the "S" direction and stops for a predetermined time (step S13h1 in FIG. 12). According to the second embodiment, the dispenser 50 not only stops at "S" for a predetermined time after changing its traveling direction but also stops at "T" for a predetermined time after changing its traveling direction. For example, the starting location ("S") or the turn-around location ("T") may be above the printed circuit boards 37b (and the V connection part 35b1) or above the N connection parts 34b1 (and the P connection part 33b1) extending from the side surface opposite to the printed circuit boards 37b, in a side view seen from the inner wall surface 32g (a long side of the storage part 32b) parallel to the traveling direction of the dispenser 50 as illustrated in FIG. 8. In addition, after changing its traveling direction to the "T" direction at "S" above the printed circuit boards 37b (and the V connection part 35b1), the dispenser 50 may stop longer than it does at the turn-around location "T" opposite to "S". The other steps are the same as those according to the first embodiment. Through this sealing step, regarding the sealing material 40b sealing the storage part 32b, as illustrated in FIG. 13, the height of the sealing material 40b in the output-side area 41a from the bottom surface of the sealing material 40b is higher than the height of the sealing material 40b in the intermediate area 41b from the bottom surface of the sealing material 40b. Specifically, the height in the output-side area 41a is higher than the height in the intermediate area 41b in the thickness direction of the semiconductor chip 25a, 25b from the rear surface toward the front surface thereof. In addition, the height of the sealing material 40b in the input-side area 41c from the bottom surface of the sealing material 40b is higher than the height of the sealing material 40b in the intermediate area 41b from the bottom surface of the sealing material 40b.

As described above, when the storage part 32b is sealed with the sealing material 40b, while reciprocating above the intermediate area 42b (see FIG. 10A) along the inner wall surfaces 32f and 32g, the dispenser 50 discharges the sealing material to the intermediate area 42b. In this case, when the dispenser 50 changes its traveling direction in the output-side area 41a including "S", the dispenser 50 stops at this location for a predetermined time. In addition, according to the second embodiment, when the dispenser 50 changes its traveling direction in the input-side area 41c including "T", the dispenser 50 also stops at this location for a predetermined time. By repeating this, more sealing material is discharged in the output-side area 41a than in the intermediate area 41b, and more sealing material is discharged in the input-side area 41c than in the intermediate area 41b. Thus, the thickness (volume) of the solidified sealing material 40b gradually decreases from the output-side area 41a toward the intermediate area 41b, and the surface of the solidified sealing material 40b monotonously slopes downward from the output-side area 41a toward the intermediate area 41b. In addition, the thickness (volume) of the solidified sealing material 40b gradually decreases from the input-side area 41c toward the intermediate area 41b, and the surface of the solidified sealing material 40b monotonously slopes downward from the input-side area 41c toward the intermediate area 41b. Thus, the sealing material 40b has a concave shape as a whole.

As described above, the dispenser 50 may be configured to have different discharge amounts of sealing material 40b per unit time at different locations such that the different locations have different thicknesses. For example, when the dispenser 50 is reciprocated above the intermediate area 42b (FIG. 10A) along the inner wall surfaces 32f and 32g, the dispenser 50 may discharge more sealing material 40b per unit time in the output-side area 41a and discharge less sealing material 40b per unit time as the dispenser 50 moves to the intermediate area 41b. In addition, in this case, the dispenser 50 discharges more sealing material 40b per unit time as the dispenser 50 moves to the input-side area 41c. Consequently, the sealing material 40b illustrated in FIG. 13 is obtained. Alternatively, as described above, the dispenser 50 may be configured to move at different traveling speeds at different locations such that the sealing material 40b have different thicknesses at the different locations. For example, when the dispenser 50 is reciprocated above the intermediate area 42b (FIG. 10A) along the inner wall surfaces 32f and 32g, the dispenser 50 may be configured to move at a low traveling speed in the output-side area 41a and move at a high traveling speed as the dispenser 50 moves to the intermediate area 41b. In addition, in this case, the dispenser 50 moves at a low traveling speed again as the dispenser 50 moves to the input-side area 41c. In this way, too, the sealing material 40b illustrated in FIG. 11 is obtained.

In addition, each of the inner wall surfaces 32i on which the P connection parts 33a1, 33b1, and 33c1 and the N connection parts 34a1, 34b1, and 34c1 are disposed may have chamfered corners. In this way, compared with a case in which the inner wall surfaces 32i do not have chamfered corners, thicker sealing material 40b is formed in the input-side area 41c. In this case, the surface of the solidified sealing material 40b monotonously slopes upward from the intermediate area 41b to the input-side area 41c. In addition, the individual inner wall surface 32*i* may have larger chamfered corners than those of the individual inner wall surface 32*h*. That is to say, the length of the individual inner wall surface 32*i* is shorter than the length of the individual inner wall surface 32*h*. For example, the length of the individual inner wall surface 32*h* may be between 80% and 99%, inclusive, of the length of a rectangular inner wall surface 32*h* without chamfered corners. The length of the individual inner wall surface 32*i* may be between 40% and 80%, inclusive, of a rectangular inner wall surface 32*i* without chamfered corners. In this way, as illustrated in FIG. 13, the heights of the sealing material 40*b* in the output-side area 41*a* and in the input-side area 41*c* from the bottom surface of the sealing material 40*b* are higher than the height of the sealing material 40*b* in the intermediate area 41*b* from the bottom surface of the sealing material 40*b*. Specifically, the heights in the output-side area 41*a* and input-side area 41*c* are higher than the height in the intermediate area 41*b* in the thickness direction of the semiconductor chip 25*a*, 25*b* from the rear surface toward the front surface thereof.

According to the first embodiment, too, the inner wall surfaces 32*i* on which the P connection parts 33*a*1, 33*b*1, and 33*c*1 and the N connection parts 34*a*1, 34*b*1, and 34*c*1 are disposed may have chamfered corners, too. According to the first embodiment, as illustrated in FIGS. 10A and 10B, the sealing material 40*b* in the output-side area 41*a* is thicker. According to this first embodiment, less sealing material 40*b* is used in the input-side area 41*c*, compared with a case in which the inner wall surfaces 32*i* do not have chamfered corners. To achieve this reduction, as described above, the traveling speed of the dispenser 50 in the input-side area 41*c* is increased. Alternatively, the discharge amount of the dispenser 50 from the discharge port 51 in the input-side area 41*c* is decreased.

In the case of the above semiconductor device 10, the heights of the sealing surfaces of the sealing material 40*a*, 40*b*, and 40*c*, the sealing surfaces being the front surfaces of the sealing material 40*a*, 40*b*, and 40*c*, around the printed circuit boards 37*a*, 37*b*, and 37*c* and around the areas opposite to the printed circuit boards 37*a*, 37*b*, and 37*c* over the storage parts 32*a*, 32*b*, and 32*c*, from the rear surface of the sealing material 40*a*, 40*b*, and 40*c*, are higher than the heights of the sealing surfaces of the sealing material 40*a*, 40*b*, and 40*c* around the semiconductor chips 25*a* and 25*b*. Specifically, the heights of the sealing material 40*a*, 40*b*, and 40*c* are higher around the printed circuit boards 37*a*, 37*b*, and 37*c* and around the areas opposite to the printed circuit boards 37*a*, 37*b*, and 37*c* over the storage parts 32*a*, 32*b*, and 32*c* than around the semiconductor chips 25*a* and 25*b* in the thickness direction of the semiconductor chip 25*a*, 25*b* from the rear surface toward the front surface thereof. In this way, the sealing material 40*a*, 40*b*, and 40*c* penetrate into the storage parts 32*a*, 32*b*, and 32*c* and suitably seal the semiconductor chips 25*a* and 25*b*, the printed circuit boards 37*a*, 37*b*, and 37*c*, and the areas opposite to the printed circuit boards 37*a*, 37*b*, and 37*c*. Therefore, occurrence of voids, etc. in the sealing material 40*a*, 40*b*, and 40*c* is prevented. In addition, to achieve this sealing, only the sealing material 40*a*, 40*b*, and 40*c* around the printed circuit boards 37*a*, 37*b*, and 37*c* and the areas opposite to the printed circuit boards 37*a*, 37*b*, and 37*c* are made thicker. The sealing materials 40*a*, 40*b*, and 40*c* are not made thicker as a whole. Thus, even when the semiconductor device 10 undergoes thermal deformation, increase of the thermal stress on the whole semiconductor device 10 is prevented constantly. As a result, deterioration of the reliability of the semiconductor device 10 is prevented.

Third Embodiment

Figure 14:
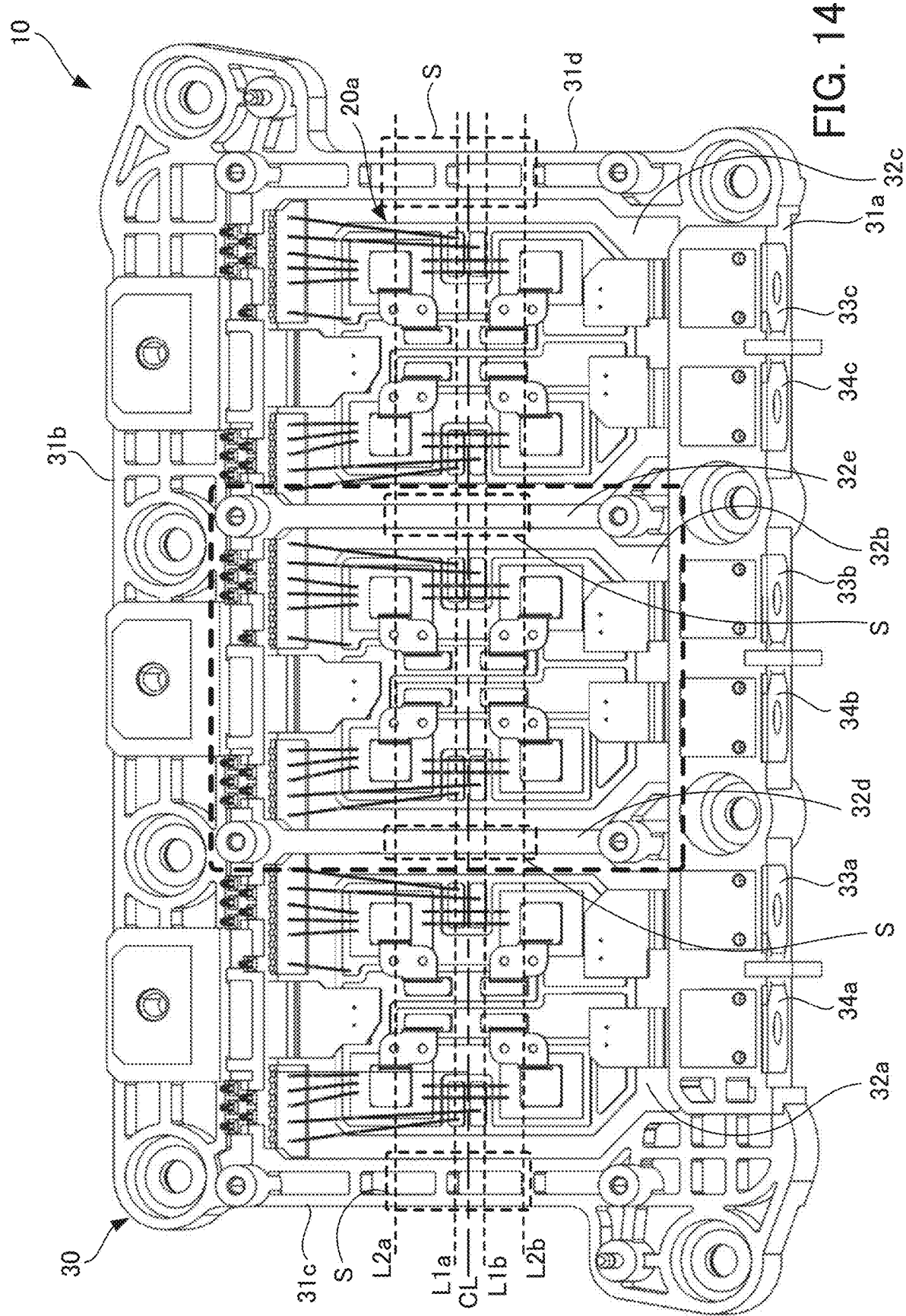
FIG. 14 is a plan view of a semiconductor device according to a third embodiment.
Figure 15:
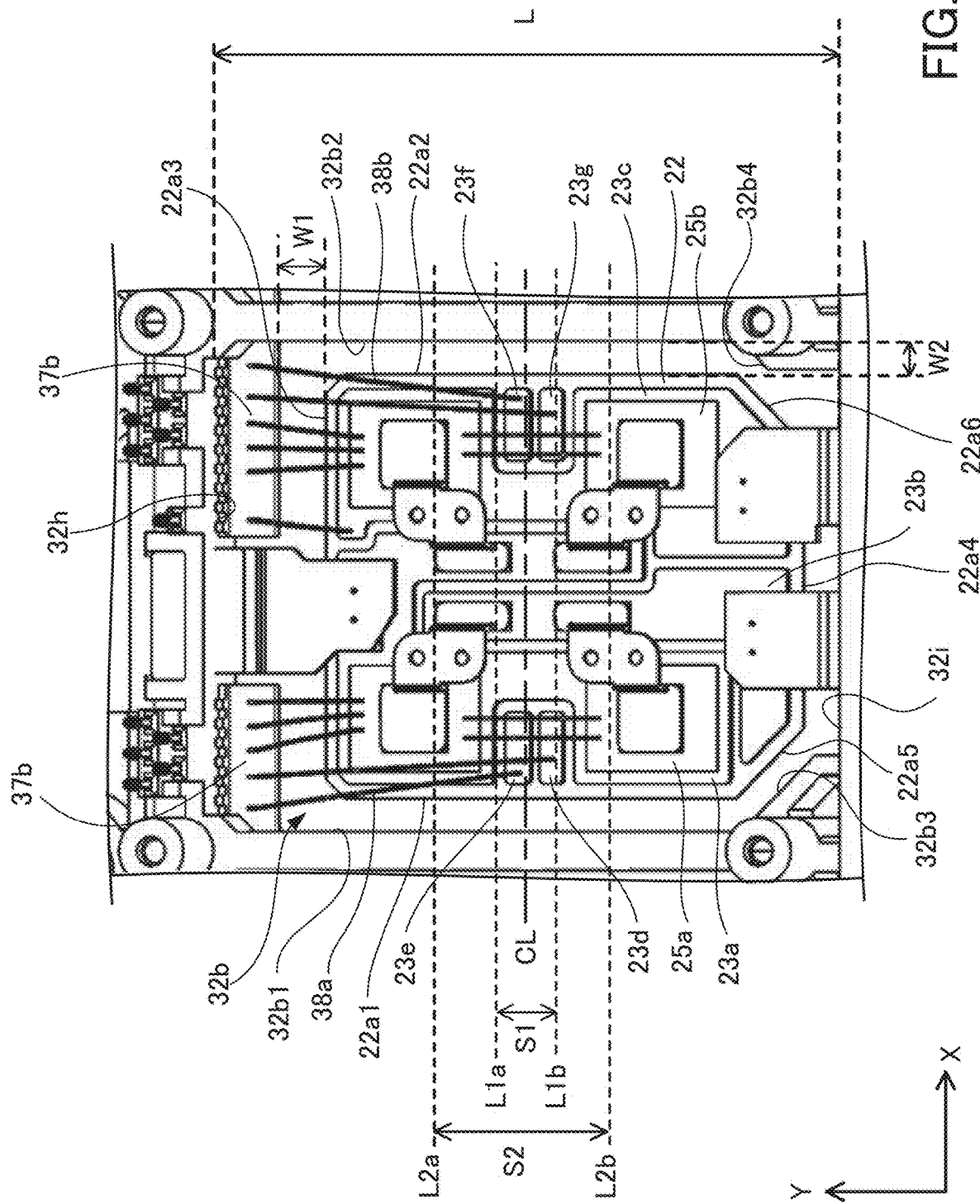
FIG. 15 is a plan view of a main part of the semiconductor device according to the third embodiment.

According to a third embodiment, an individual ceramic circuit board 21 stored in the corresponding one of the storage parts 32*a*, 32*b*, and 32*c* of a case 30 has a smaller area in a plan view than that of the individual ceramic circuit board 21 according to the first embodiment. The third embodiment will be described with reference to FIGS. 14 and 15. FIG. 14 is a plan view of a semiconductor device according to the third embodiment, and FIG. 15 is a plan view of a main part of the semiconductor device according to the third embodiment. Sealing material is not illustrated in FIGS. 14 and 15. FIG. 15 is an enlarged view of a storage part 32*b* enclosed by a dashed line in FIG. 14. The case 30 in FIGS. 14 and 15 is the same as the case 30 (FIGS. 5 and 6) according to the first embodiment. A semiconductor unit 20*a* in FIGS. 14 and 15 has the same configuration as that of the semiconductor unit 20 (FIG. 4) according to the first embodiment, except the size. The elements to be described below are denoted by reference characters in FIGS. 14 and 15. The case 30 in FIG. 14 has a flat frame-part long side 31*a*. The frame-part long side 31*a* of the case 30 in FIG. 14 is the same as the frame-part long side 31*a* of the case 30 according to the first embodiment in the other aspects.

As illustrated in FIG. 14, the semiconductor unit 20*a* is stored in each of the storage parts 32*a*, 32*b*, and 32*c* of the case 30 of the semiconductor device 10 according to the third embodiment. In this case, the individual semiconductor unit 20*a* is stored in the corresponding one of the storage parts 32*a*, 32*b*, and 32*c* with a larger gap, compared with the first embodiment.

While the individual semiconductor unit 20*a* has the same configuration as that of the individual semiconductor unit 20, the size of the individual insulating plate 22 included in the individual ceramic circuit board 21 is smaller than that of the individual insulating plate 22 included in the individual semiconductor unit 20. The size of the insulating plate 22 will be described below. The insulating plate 22 is enclosed by a pair of opposite long sides 22*a*1 and 22*a*2, a pair of opposite short sides 22*a*3 and 22*a*4, and corner sides 22*a*5 and 22*a*6, as illustrated in FIG. 15. The short side 22*a*3 is perpendicular to the pair of long sides 22*a*1 and 22*a*2. The short side 22*a*4 faces the short side 22*a*3. The length of the short side 22*a*4 (along the X axis) is shorter than the length of the short side 22*a*3 (along the X axis). The corner sides 22*a*5 and 22*a*6 connect the pair of long sides 22*a*1 and 22*a*2 and the short side 22*a*4.

In addition, as described above, a plurality of circuit patterns 23*a*, 23*b*, 23*c*, 23*d*, 23*e*, 23*f*, and 23*g* are formed on the front surface of the insulating plate 22. The circuit patterns 23*a* and 23*c* are formed along the long sides 22*a*1 and 22*a*2 on the front surface of the insulating plate 22, respectively, between the short side 22*a*3 and the short side 22*a*4 (along the Y axis). The circuit patterns 23*a* and 23*c* have a concave part that is open along long side 22*a*1 and 22*a*2, respectively, in the middle thereof. The semiconductor chips 25*a* on both sides of this concave part are bonded to the circuit pattern 23*a*. In addition, the semiconductor chips 25*b* on both sides of this concave part are bonded to the circuit pattern 23*c*.

The circuit patterns 23*e* and 23*d* are formed at the concave part of the circuit pattern 23*a* along the long side 22*a*1. The circuit patterns 23*f* and 23*g* are formed at the concave part of the circuit pattern 23*b* along the long side 22*a*2. In addition, the circuit patterns 23*b* and 23*h* are also formed on the front surface of the insulating plate 22 along the long sides 22a1 and 22a2 between the short side 22a3 and the short side 22a4 (along the Y axis).

The individual semiconductor unit 20a as described above is stored in the corresponding one of the storage parts 32a, 32b, and 32c with predetermined distances from the individual inner wall surfaces. Hereinafter, the semiconductor unit 20a stored in the storage part 32b will be described as an example with reference to FIG. 15. The description of the storage part 32b will also be applied to the storage parts 32a and 32c.

The storage part 32b is an area enclosed by a pair of opposite inner wall surface 32b1 and 32b2 (long-side inner wall surfaces), the inner wall surface 32h (one inner wall surface), the inner wall surface 32i (another inner wall surface), and inner wall surfaces 32b3 and 32b4 (corner-side inner wall surfaces). This area of the storage part 32b in a plan view is similar to the shape of the insulating plate 22 of the corresponding ceramic circuit board 21.

The inner wall surfaces 32b1 and 32b2 correspond to the inner wall surfaces 32f and 32g according to the first embodiment. The inner wall surfaces 32b1 and 32b2 are flat surfaces without concavity and convexity, unlike the inner wall surfaces 32f and 32g. In addition, the inner wall surfaces 32b1 and 32b2 are parallel to the long sides 22a1 and 22a2 of the insulating plate 22 included in the ceramic circuit board 21. In addition, the inner wall surfaces 32b1 and 32b2 are separated from the long sides 22a1 and 22a2 of the insulating plate 22, respectively, by a distance W2 (along the X axis).

As described above, the inner wall surface 32h is perpendicular to the pair of inner wall surfaces 32b1 and 32b2, and the printed circuit boards 37b are formed perpendicularly to the storage part 32b. The inner wall surface 32i faces the inner wall surface 32h. The length of the inner wall surface 32h (along the X axis) is longer than the length of the inner wall surface 32i (along the X axis). The inner wall surface 32h is parallel to the short side 22a3 of the insulating plate 22 included in the ceramic circuit board 21. In addition, the inner wall surface 32h is separated from the short side 22a3 of the insulating plate 22 by a distance W1 (along the Y axis). In addition, the storage part 32b has a length L (along the Y axis) from the inner wall surface 32h to the inner wall surface 32i.

The inner wall surfaces 32b3 and 32b4 are connected to the pair of inner wall surfaces 32b1 and 32b2, respectively, extend to the inner wall surface 32i, and are located at corners of the storage part 32b. In addition, the inner wall surfaces 32b3 and 32b4 are parallel to the corner sides 22a5 and 22a6 of the insulating plate 22 included in the ceramic circuit board 21 and are separated from each other. The inner wall surfaces 32b3 and 32b4 and the inner wall surface 32i form steps in a plan view.

As in the first and second embodiments, by sealing the storage parts 32a, 32b, and 32c of the case 30 in which the sealing semiconductor units 20a are stored with sealing material, the semiconductor device is obtained.

There is set a center line CL parallel to the inner wall surfaces 32h and 32i of the storage part 32b in which the semiconductor unit 20a is stored. The center line CL goes through the center of the storage part 32b. In addition, for the ceramic circuit board 21 stored in the storage part 32b, there is set a first stress concentration area S1 between lines L1a and L1b, which are separated from the center line CL by approximately an equal distance in the directions of the inner wall surfaces 32h and 32i, respectively (along the Y axis).

In addition, for the ceramic circuit board 21 stored in the storage part 32b, there is set a second stress concentration area S2 between lines L2a and L2b, which are separated from the center line CL by approximately an equal distance in the directions of the inner wall surfaces 32h and 32i, respectively. The second stress concentration area S2 is set outside the first stress concentration area S1 (along the Y axis). The center line CL, the first stress concentration area S1, and the second stress concentration area S2 are set not only in the storage part 32b but also in the entire case 30 (semiconductor device).

Since components of the semiconductor device 10 have different thermal linear expansion coefficients, if a temperature cycle test is performed on the semiconductor device 10, the semiconductor device 10 is warped due to the temperature change. Specifically, the case 30 is warped. More specifically, the area corresponding to the center line CL protrudes as illustrated in FIG. 14. In this case, stress occurs in the area (the second stress concentration area S2) between the lines L2a and L2b. In addition, more stress occurs in the area (the first stress concentration area S1) between the lines L1a and L1b. In this case, the largest stress occurs in individual stress areas S along the frame-part short sides 31c and 31d and the partition parts 32d and 32e of the case 30 in the second stress concentration area S2. For example, according to the first embodiment, if a part of a ceramic circuit board 21 is included in such a stress area S, the solder under this part of the ceramic circuit board 21 could be damaged. If the case 30 is warped, the solder under the corners of the ceramic circuit board 21 is also damaged easily.

If solder is damaged and deteriorated, the thermal conductivity of this part is deteriorated, resulting in deterioration of the heat radiation performance of the semiconductor device 10. In the storage part 32b, the lines L1a and L1b beside the first stress concentration area S1 may be parallel to the inner wall surfaces 32h and 32i and the center line CL. In addition, the lines L1a and L1b may be separated from the center line CL in the directions of the inner wall surfaces 32h and 32i, respectively, by a first target distance (along the Y axis). For example, the first target distance is between 2% and 6%, inclusive, of the length L of the storage part 32b, preferably 4%. In addition, the lines L2a and L2b beside the second stress concentration area S2 may be parallel to the inner wall surfaces 32h and 32i and the center line CL. In addition, the lines L2a and L2b may be separated from the center line CL in the directions of the inner wall surfaces 32h and 32i, respectively, by a second target distance (along the Y axis). For example, the second target distance is between 10% and 15%, inclusive, of the length L of the storage part 32b, preferably, 12.5%. The same applies to the storage parts 32a and 32c.

Thus, according to the third embodiment, as illustrated in FIG. 15, the ceramic circuit board 21 of the individual semiconductor unit 20a is separated from the inner wall surface 32h of the storage part 32b by the distance W1 and from the inner wall surfaces 32b1 and 32b2 of the storage part 32b by the distance W2. In this way, by evacuating the ceramic circuit board 21 from the stress areas S in which stress easily occurs, less stress occurs on the solder under the ceramic circuit board 21. In addition, by separating the ceramic circuit board 21 from the inner wall surface 32h of the storage part 32b by the distance W1, the rear surfaces of the printed circuit boards 37b are certainly sealed with the sealing material 40b. Likewise, the ceramic circuit board 21 is separated from the inner wall surfaces 32b1 and 32b2 of the storage part 32b by the distance W2 and is separated from the inner wall surfaces 32b3 and 32b4 and the inner wall surface 32i of the storage part 32b. In this way, less stress occurs on the solder under the ceramic circuit board 21. In addition, the sealing resin is easily penetrated into the individual gaps. Thus, the ceramic circuit board 21 is sealed more certainly in the storage part 32b.

To reduce the stress on the ceramic circuit board 21 in the storage part 32b, it is desirable that the distance W1 from the ceramic circuit board 21 to the storage part 32b be between 4% and 16%, inclusive, of the length L of the storage part 32b. In addition, the distance W2 is between 4% and 16%, inclusive, of the length L of the storage part 32b. To reduce the stress on the ceramic circuit board 21 in the storage part 32b, at least one of the distances W1 and W2 is secured. To reduce the stress more certainly, it is desirable that both of the distances W1 and W2 be secured.

In addition, the corner sides 22a5 and 22a6 and the short side 22a4 of the ceramic circuit board 21 of the semiconductor unit 20a are parallel to and separated by a predetermined distance from the inner wall surfaces 32b3 and 32b4 and the inner wall surface 32i of the storage part 32b. In addition, the corners of the ceramic circuit board 21 are not sharply angulated. Thus, even if stress occurs in the ceramic circuit board 21, the stress on the solder under the corners where stress occurs easily is reduced.

In addition, in a plan view, the shape of the storage part 32b is similar to the shape of the insulating plate 22 of the ceramic circuit board 21, as described above. Thus, the stress on the ceramic circuit board 21 is reduced.

In addition, unlike the inner wall surfaces 32f and 32g of the storage part 32b according to the first embodiment, the inner wall surfaces 32b1 and 32b2 of the storage part 32b are flat surfaces without concavity and convexity. If stress occurs on the inner wall surfaces 32f and 32g, which have convex parts, of the storage part 32b according to the first embodiment, the stress is concentrated on the convex parts. As a result, the inner wall surfaces 32f and 32g could be damaged, starting with the convex parts. According to the third embodiment, since the inner wall surfaces 32b1 and 32b2 of the storage part 32b are flat surfaces, the concentration of stress is reduced, and damage to the inner wall surfaces 32b1 and 32b2 is prevented.

In addition, the semiconductor chips 25a are formed on the circuit pattern 23a outside the first stress concentration area S1, more specifically, from the first stress concentration area S1 toward the inner wall surfaces 32h and 32i (along the Y axis). Likewise, the semiconductor chips 25b are formed on the circuit pattern 23c outside the first stress concentration area S1, more specifically, from the first stress concentration area S1 toward the inner wall surfaces 32h and 32i (along the Y axis). Thus, the stress on the semiconductor chips 25a and 25b is avoided, and damage thereto is prevented.

In addition, the circuit patterns 23a and 23c are formed on the front surface of the insulating plate 22 from the short side 22a3 to the short side 22a4 (along the Y axis) along the long sides 22a1 and 22a2. Even if the case 30 is warped centering around the center line CL, since the circuit patterns 23a and 23c are also warped with the warpage of the case 30, the resultant stress is reduced. As a result, occurrence of damage is prevented.

In addition, the semiconductor unit 20a and the printed circuit boards 37b are electrically and mechanically connected to each other via a plurality of bonding wires. Among the plurality of bonding wires, the outermost bonding wires 38a and 38b (which are near the inner wall surfaces 32b1 and 32b2) are connected to the circuit patterns 23e and 23f of the ceramic circuit board 21, respectively. These outermost bonding wires 38a and 38b run toward the inner side of the ceramic circuit board 21. That is to say, the outermost bonding wires 38a and 38b cross the long sides 22a1 and 22a2 of the insulating plate 22 of the ceramic circuit board 21 and connect the printed circuit boards 37b and the circuit patterns 23e and 23f, respectively. In addition, the connection part (the other end) of each of the outermost bonding wires 38a and 38b to the corresponding one of the circuit patterns 23e and 23f may be located in the second stress concentration area S2. Thus, the circuit patterns 23e and 23f may be included in the second stress concentration area S2 at least partially. If the connection part of each of the bonding wires 38a and 38b to the corresponding one of the circuit patterns 23e and 23f is located inside the first stress concentration area S1, stress is applied to these connection parts, and the bonding wires 38a and 38b could be peeled from the circuit patterns 23e and 23f. By connecting the bonding wires 38a and 38b to the circuit patterns 23e and 23f in areas outside the first stress concentration area S1, such peeling is prevented.

The above semiconductor device and semiconductor device manufacturing method allow the sealing material to suitably penetrate into the case. Thus, it is possible to prevent, for example, occurrence of voids and deterioration of the reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor chip having a front surface and a rear surface, the semiconductor chip including a main electrode on the front surface thereof;
   an insulating circuit board, including
   an insulating plate, and
   a circuit pattern formed on a front surface of the insulating plate, the rear surface of the semiconductor chip being disposed on the circuit pattern;
   a case including
   a frame part having an opening that is substantially rectangular in a plan view of the semiconductor device, inner wall surfaces of the frame part at the opening forming a storage part to store the insulating circuit board, and
   a printed circuit board which has a flat plate shape and which is formed to protrude from one of the inner wall surfaces of the frame part toward the storage part; and
   a sealing material filled in the storage part, to thereby seal the semiconductor chip and the printed circuit board, wherein
   a front surface of the sealing material forms a sealing surface, and
   in a thickness direction of the semiconductor chip, the sealing surface is higher around the printed circuit board than around the semiconductor chip.

2. The semiconductor device according to claim 1, wherein the sealing surface monotonously slopes downward from around the printed circuit board toward around the semiconductor chip.

3. The semiconductor device according to claim 2, wherein
the inner wall surfaces of the frame part include another inner wall surface facing said one inner wall surface, and
the sealing surface monotonously slopes downward from around said another inner wall surface toward around the semiconductor chip.

4. The semiconductor device according to claim 3, wherein
the case further includes a second external connection terminal having, at an end thereof, a second internal connection part, and
the second internal connection part protrudes, in the plan view, toward the storage part from a center part of said another inner wall surface, and is sealed by the sealing material.

5. The semiconductor device according to claim 1, wherein the printed circuit board is formed at least at one corner of the storage part in the plan view.

6. The semiconductor device according to claim 5, wherein
the case further includes a first external connection terminal having, at an end thereof, a first internal connection part, and
the first internal connection part protrudes, in the plan view, toward the storage part from a center part of said one inner wall surface of the frame part, and is sealed by the sealing material.

7. The semiconductor device according to claim 6, wherein the first internal connection part is formed to be higher than the printed circuit board in the thickness direction of the semiconductor chip.

8. The semiconductor device according to claim 1, wherein
the one inner wall surface forms one short side of the storage part, and
the printed circuit board protrudes from the one short side toward an inside of the storage part.

9. The semiconductor device according to claim 1, wherein
the storage part has two long sides and two short sides, and
in a cross-sectional view of the semiconductor device perpendicular to the two long sides, the sealing surface is higher around the semiconductor chip than around the two long sides.

10. The semiconductor device according to claim 1, wherein the sealing material contains epoxy resin containing a first filler as a main component thereof.

11. The semiconductor device according to claim 10, wherein the frame part contains polyphenylene sulfide (PPS) resin containing a second filler as a main component thereof.

12. The semiconductor device according to claim 11, wherein the printed circuit board includes
an insulating layer containing glass epoxy resin or phenol resin as a main component thereof, and
a circuit layer formed on a front surface of the insulating layer and containing copper as a main component thereof, and
wherein the printed circuit board has a resist film on a front surface thereof.

13. The semiconductor device according to claim 1, wherein
the insulating circuit board has a first short side facing the one inner wall surface,
the printed circuit board has an end facing the storage part, and
the first short side of the insulating circuit board is separate from the end of the printed circuit board by a first distance in the plan view.

14. The semiconductor device according to claim 13, wherein the insulating circuit board is substantially rectangular in the plan view, and includes a pair of short sides, of which one is the first short side, and a pair of long sides perpendicular to the pair of short sides,
wherein the inner wall surfaces of the frame part include a pair of short-side inner wall surfaces, of which one is said one inner wall surface, and a pair of long-side inner wall surfaces perpendicular to the pair of short-side inner wall surfaces, and
wherein the pair of long sides of the insulating circuit board are respectively separated from the pair of long-side inner wall surfaces by a second distance in the plan view.

15. The semiconductor device according to claim 14, wherein
the pair of long sides of the insulating circuit board are parallel to the pair of long-side inner wall surfaces in the plan view, and
the pair of long-side inner wall surfaces are flat surfaces.

16. The semiconductor device according to claim 14, wherein
the pair of short sides of the insulating circuit board includes a second short side that faces the first short side, and that is shorter than the first short side in the plan view,
the insulating circuit board further includes a pair of corner sides that respectively connect the pair of long sides to the second short side, and
the inner wall surfaces of the frame part further include a pair of corner-side inner wall surfaces that are respectively connected to the pair of long-side inner wall surfaces, and are respectively parallel to the pair of corner sides of the insulating circuit board.

17. The semiconductor device according to claim 14, wherein
the semiconductor device has a first stress concentration area which is set between a pair of first lines that are respectively parallel to the pair of short-side inner wall surfaces in the plan view, wherein
a center line is a line passing through a center of the storage part in parallel to the the pair of short-side inner wall surfaces, and
each of the first lines is separated from the center line by a first target distance; and
the semiconductor chip is disposed on the circuit pattern outside the first stress concentration area.

18. The semiconductor device according to claim 17, wherein the circuit pattern is formed on the front surface of the insulating plate in the first stress concentration area.

19. The semiconductor device according to claim 17, wherein the first target distance is between 2% and 6%, inclusive, of a distance between the pair of short-side inner wall surfaces in a direction perpendicular to the center line.

20. The semiconductor device according to claim 17, wherein the insulating circuit board further includes a plurality of side circuit patterns formed to face the pair of long sides thereof on the front surface of the insulating plate; and a plurality of wiring members, wherein in the plan view, each of the wiring members has one end bonded to a part of the printed circuit board, and another end bonded to one of the side circuit patterns, and the wiring members extend over the pair of long sides of the insulating circuit board.

21. The semiconductor device according to claim 20, wherein the another end of each wiring member is formed in a second stress concentration area set between a pair of second lines, each of which is separated by a second target distance, longer than the first target distance, from the center line in the plan view.

22. The semiconductor device according to claim 21, wherein the second target distance is between 10% and 15%, inclusive, of a distance between the pair of short-side inner wall surfaces in a direction perpendicular to the center line.

23. The semiconductor device according to claim 14, wherein the second distance is 4% and 16%, inclusive, of a distance between the pair of long-side inner wall surfaces in a direction perpendicular to the center line.

24. The semiconductor device according to claim 13, wherein the inner wall surfaces of the frame part include another inner wall surface facing said one inner wall surface, and the first distance is between 4% and 16%, inclusive, of a distance between the one inner wall surface and the another inner wall.

* * * * *